US011756935B2

(12) United States Patent
Shin et al.

(10) Patent No.: US 11,756,935 B2
(45) Date of Patent: Sep. 12, 2023

(54) CHIP-STACKED SEMICONDUCTOR PACKAGE WITH INCREASED PACKAGE RELIABILITY

(71) Applicant: SAMSUNG ELECTRONICS CO., LTD., Suwon-si (KR)

(72) Inventors: Insup Shin, Seoul (KR); Hyeongmun Kang, Hwaseong-si (KR); Jungmin Ko, Hwaseong-si (KR); Hwanyoung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 123 days.

(21) Appl. No.: 17/352,757

(22) Filed: Jun. 21, 2021

(65) Prior Publication Data

US 2021/0398947 A1  Dec. 23, 2021

(30) Foreign Application Priority Data

Jun. 23, 2020 (KR) .......................... 10-2020-0076762

(51) Int. Cl.
*H01L 25/065* (2023.01)
*H01L 25/18* (2023.01)
*H01L 25/00* (2006.01)

(52) U.S. Cl.
CPC .......... *H01L 25/0657* (2013.01); *H01L 25/18* (2013.01); *H01L 25/50* (2013.01); *H01L 2225/06513* (2013.01); *H01L 2225/06541* (2013.01); *H01L 2225/06562* (2013.01); *H01L 2225/06586* (2013.01)

(58) Field of Classification Search
CPC .................................................. H01L 25/0657
See application file for complete search history.

(56) References Cited

U.S. PATENT DOCUMENTS

| 6,392,292 | B1 | 5/2002 | Morishita |
| 6,686,654 | B2 | 2/2004 | Farrar et al. |
| 7,638,869 | B2 * | 12/2009 | Irsigler ............... H01L 25/0657 257/774 |
| 8,178,971 | B2 | 5/2012 | Fujii |
| 8,664,780 | B2 | 3/2014 | Han et al. |

(Continued)

FOREIGN PATENT DOCUMENTS

| CN | 104377192 A | * | 2/2015 | ....... H01L 21/31053 |
| KR | 10-1069441 | | 9/2011 | |

(Continued)

*Primary Examiner* — Mamadou L Diallo
(74) *Attorney, Agent, or Firm* — F. Chau & Associates, LLC

(57) ABSTRACT

A chip-stacked semiconductor package includes: a base chip having a base through via; a first chip stacked on the base chip in an offset form, wherein the first chip has a first exposed surface and a first through via electrically connected to the base through via; a first molding layer positioned on the base chip and covering a first non-exposed surface, facing the first exposed surface, of the first chip; a second chip stacked on the first chip in an offset form, wherein the second chip has a second exposed surface and a second through via electrically connected to the first through via; and a second molding layer formed on the first chip and covering a second non-exposed surface, facing the second exposed surface, of the second chip.

19 Claims, 21 Drawing Sheets

(56) References Cited

U.S. PATENT DOCUMENTS

| | | | |
|---|---|---|---|
| 9,397,052 B2 | 7/2016 | Park et al. | |
| 10,062,668 B2 | 8/2018 | Pagani | |
| 11,380,645 B2* | 7/2022 | Yu | H01L 25/50 |
| 2006/0255471 A1 | 11/2006 | Lee et al. | |
| 2010/0193930 A1* | 8/2010 | Lee | H01L 24/24 |
| | | | 257/E23.173 |
| 2014/0062587 A1* | 3/2014 | Koyanagi | H01L 23/50 |
| | | | 327/595 |
| 2015/0037914 A1* | 2/2015 | Takahashi | H01L 22/14 |
| | | | 438/15 |
| 2015/0162265 A1* | 6/2015 | Jo | H01L 25/50 |
| | | | 257/774 |
| 2016/0148906 A1* | 5/2016 | Lee | H01L 25/0657 |
| | | | 257/774 |
| 2019/0259742 A1* | 8/2019 | Han | H01L 24/49 |
| 2020/0006293 A1* | 1/2020 | Sankman | H01L 24/17 |
| 2020/0020606 A1 | 1/2020 | Kim et al. | |
| 2020/0020668 A1* | 1/2020 | Kim | H01L 23/562 |
| 2020/0075551 A1* | 3/2020 | Oh | H01L 24/17 |
| 2020/0194404 A1* | 6/2020 | Chen | H01L 25/0652 |
| 2021/0028146 A1* | 1/2021 | Lee | H01L 25/105 |
| 2021/0057379 A1* | 2/2021 | Kim | H01L 21/56 |
| 2021/0090966 A1* | 3/2021 | Kuo | H01L 23/5389 |
| 2021/0217700 A1* | 7/2021 | Choi | H01L 24/20 |
| 2021/0265273 A1* | 8/2021 | Chang Chien | H01L 23/3675 |
| 2021/0358888 A1* | 11/2021 | Boo | H01L 25/0657 |
| 2022/0059500 A1* | 2/2022 | Ko | H01L 21/76802 |
| 2022/0208728 A1* | 6/2022 | Monadgemi | H01L 25/105 |
| 2022/0208744 A1* | 6/2022 | Ng | H01L 25/50 |

FOREIGN PATENT DOCUMENTS

| | | | |
|---|---|---|---|
| KR | 10-2012-0005340 | 1/2012 | |
| WO | WO-2021231636 A1 * | 11/2021 | H01L 23/13 |

* cited by examiner

CHIP-STACKED SEMICONDUCTOR PACKAGE WITH INCREASED PACKAGE RELIABILITY

CROSS-REFERENCE TO RELATED APPLICATION

This application claims priority under 35 U.S.C. § 119 to Korean Patent Application No. 10-2020-0076762, filed on Jun. 23, 2020, in the Korean Intellectual Property Office, the disclosure of which is incorporated by reference herein in its entirety.

TECHNICAL FIELD

The present invention relates to a chip stacked semiconductor package, and more particularly, to a semiconductor package with increased package reliability.

DISCUSSION OF THE RELATED ART

According to the trend towards multifunctional high capacity, and miniaturized electronic products, a chip-stacked semiconductor package in which two or more chips (e.g., semiconductor devices) are stacked has been under development. In a chip-stacked semiconductor package, since each chip in the chip-stacked semiconductor package generates heat, the package reliability may be degraded.

SUMMARY

According to an exemplary embodiment of the present invention, a chip-stacked semiconductor package includes: a base chip having a base through via; a first chip stacked on the base chip in an offset form, wherein the first chip has a first exposed surface and a first through via electrically connected to the base through via; a first molding layer positioned on the base chip and covering a first non-exposed surface, facing the first exposed surface, of the first chip; a second chip stacked on the first chip in an offset form, wherein the second chip has a second exposed surface and a second through via electrically connected to the first through via; and a second molding layer formed on the first chip and covering a second non-exposed surface, facing the second exposed surface, of the second chip.

In an exemplary embodiment of the present invention, a width of the base chip is greater than a width of the first chip and a width of the second chip.

In an exemplary embodiment of the present invention, the base through via is mirror symmetrical with respect to the first through via, and the second through via is mirror symmetrical with respect to the first through via.

In an exemplary embodiment of the present invention, the base through via, the first through via and the second through via are not positioned at a center of the base chip, a center of the first chip and a center of the second chip, respectively.

In an exemplary embodiment of the present invention, an upper surface of the second chip is exposed.

In an exemplary embodiment of the present invention, the first chip is offset-stacked on the base chip in a first offset direction with respect to the base chip, and the second chip is offset-stacked on the first chip in a second offset direction opposite to the first offset direction with respect to the first chip.

In an exemplary embodiment of the present invention, the base chip is a buffer chip or a logic chip, and the first chip and the second chip are of the same type or different types of chips as each other.

In an exemplary embodiment of the present invention, the base through via of the base chip further comprises an external connection member, and the external connection member is connected to a connection pad of a printed circuit board or an interposer board.

According to an exemplary embodiment of the present invention, a chip-stacked semiconductor package includes: a base chip having a base through via; a plurality of middle chips stacked on the base chip in an offset form, wherein the middle chips each have an exposed surface and a through via electrically connected to a first connection member that is connected to the base through via; a first molding layer disposed on the base chip, and covering a non-exposed surface of at least one middle chip of the plurality of middle chips; an upper chip stacked on an uppermost middle chip among the middle chips in an offset form and having a second connection member electrically connected to the through via of the uppermost middle chip; and a second molding layer formed to be in contact with a side surface of the upper chip.

In an exemplary embodiment of the present invention, a width of the base chip is greater than a width of each of the middle chips and the upper chip.

In an exemplary embodiment of the present invention, the through via of first middle chip of the plurality of middle chips is mirror symmetrical with respect to the base through via, and the second connection member overlaps the through via of the uppermost middle chip.

In an exemplary embodiment of the present invention, a surface of the upper chip is exposed.

In an exemplary embodiment of the present invention, the middle chips comprise a first middle chip and a second middle chip, wherein the first middle chip is stacked on the base chip and misaligned with the base chip, and wherein the second middle chip is stacked on the first middle chip and misaligned with the first middle chip.

In an exemplary embodiment of the present invention, the base chip is a buffer chip or a logic chip, and the middle chips and upper chips are the same or different types of chips from each other.

According to an exemplary embodiment of the present invention, a chip-stacked semiconductor package includes: a base chip including a base chip body, a base through via, and an external connection member, wherein the base chip body has a base front surface and a base rear surface opposite to the base front surface, wherein the base through via passes through the base chip body, and the external connection member is disposed on the base front surface and is electrically connected to the base through via; a first chip stacked in an offset form on the base rear surface of the base chip, wherein the first chip includes a first chip body, a first through via, and a first connection member, wherein the first chip body has a first front surface, a first rear surface opposite to the first front surface, and a first exposed surface, wherein the first through via passes through the first chip body, and the first connection member is electrically connected to the base through via; a first molding layer formed on a base rear surface of the base chip in contact with a first non-exposed surface, facing the first exposed surface, of the first chip; a second chip stacked in an offset form on the first rear surface of the first chip, wherein the second chip includes a second through via, a second connection member, and a second chip body having a second front surface, a second rear surface opposite to the second front surface, and a second exposed surface, wherein the second through via passes through the second chip body, and the second connection member is electrically connected to the first through via; and a second molding layer formed on the first rear surface of the first chip to be in contact with a second non-exposed surface, facing the second exposed surface, of the second chip.

In an exemplary embodiment of the present invention, a width of the base chip is greater than a width of each of the first chip and the second chip, wherein the base through via is mirror symmetrical with respect to the first through via, and wherein the second through-via is mirror symmetrical with respect to the first through-via.

In an exemplary embodiment of the present invention, an upper surface of the second chip is exposed, and the second molding layer is formed on two sides of the second chip.

In an exemplary embodiment of the present invention, an underfill layer is further formed between the base rear surface of the base chip and the first front surface of the first chip, and between the first rear surface of the first chip and the second front surface of the second chip.

In an exemplary embodiment of the present invention, the first chip is offset-stacked in a first direction on the base chip, and the second chip is offset-stacked in a second direction, opposite to the first direction, on the first chip.

In an exemplary embodiment of the present invention, the first chip is offset-stacked on the base chip in the second direction and a third direction crossing the second direction, and the second chip is offset-stacked on the first chip in the first direction and a fourth direction opposite to the third direction.

BRIEF DESCRIPTION OF THE DRAWINGS

The above and other features of the present invention will become more apparent by describing in detailed exemplary embodiments thereof with reference to the accompanying drawings, in which.

DETAILED DESCRIPTION OF THE EMBODIMENTS

Figure 1:
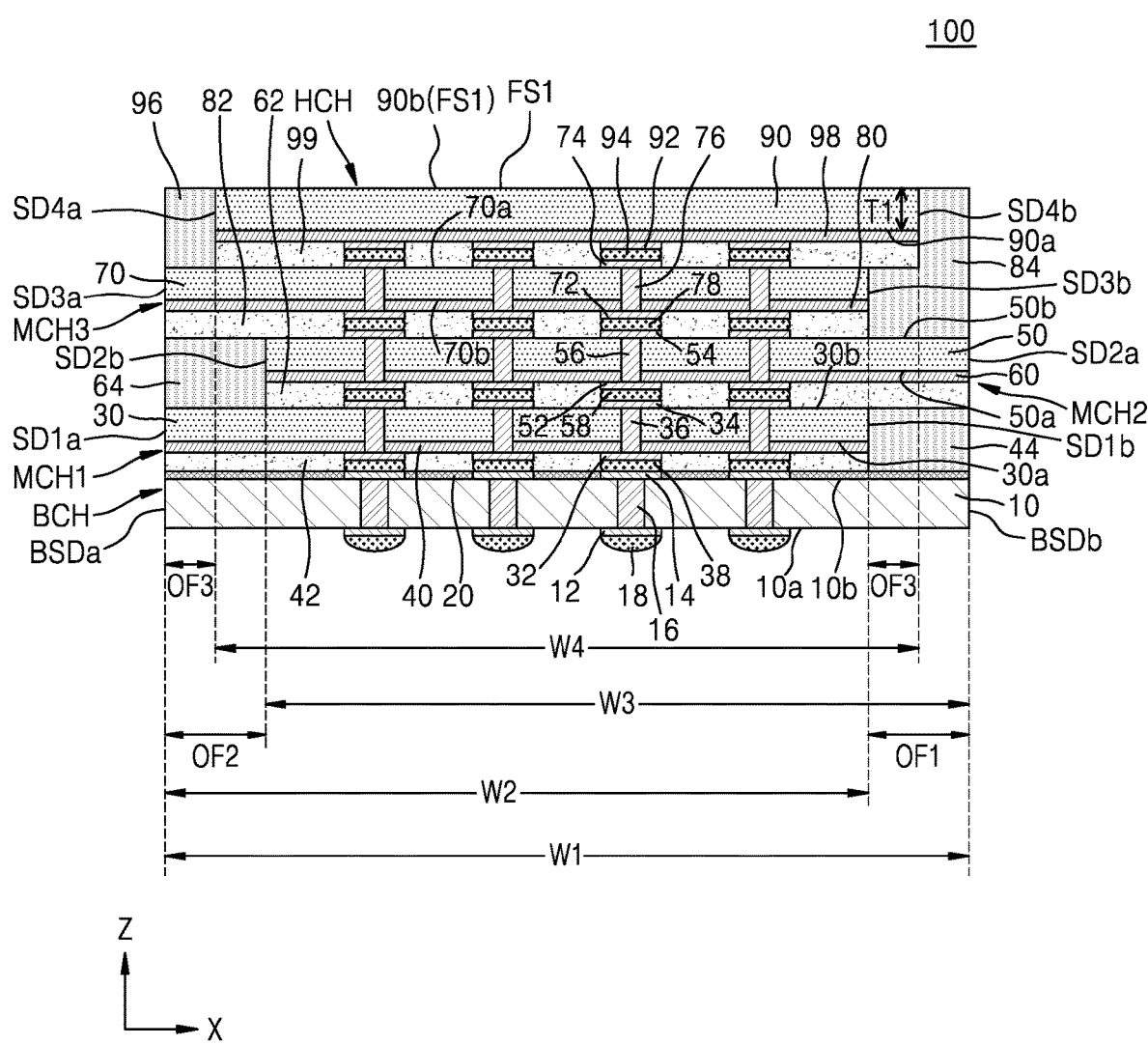
FIG. 1 is a cross-sectional view of a main part of a chip-stacked semiconductor package according to an exemplary embodiment of the present invention.

Hereinafter, exemplary embodiments of the present invention will be described in detail with reference to the accompanying drawings. The following exemplary embodiments of the present invention may be implemented individually, and in addition, the following exemplary embodiments of the present invention may be implemented by being combined with one another. Therefore, the technical idea of the present invention is not limited to one exemplary embodiment. It will be understood that the singular form of the elements may include a plurality unless the context clearly indicates a different case. In the drawings, sizes of elements in the drawings may be exaggerated for clarity. In other words, since sizes and thicknesses of components in the drawings may be exaggerated for clarity, the following exemplary embodiments of the present invention are not limited thereto.

Figure 2:
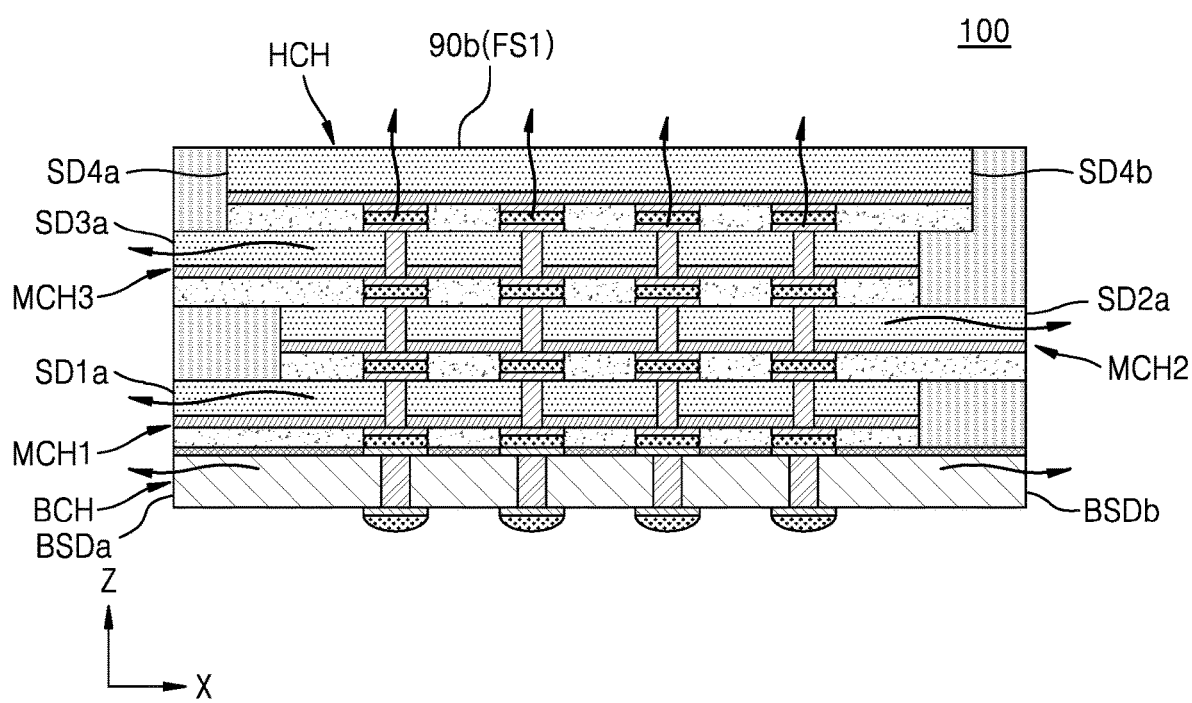
FIG. 2 is a cross-sectional view of a main part for illustrating heat dissipation in the chip-stacked semiconductor package of 1.

FIG. 1 is a cross-sectional view of a main part of a chip stacked semiconductor package according to an exemplary embodiment of the present invention, and FIG. 2 is a cross-sectional view of a main part for illustrating heat dissipation of the chip stacked semiconductor package of FIG. 1.

For example, the chip stacked semiconductor package 100 may include a base chip BCH (or, e.g., a lower chip), a plurality of middle chips MCH1, MCH2, and MCH3, and an upper chip HCH. The chip stacked semiconductor package 100 may include middle chips MCH1, MCH2, and MCH3 stacked on the base chip BCH in an offset form and an upper chip HCH stacked on the middle chips MCH1, MCH2, and MCH3 in an offset form. For example, the chip stacked semiconductor package 100 may include middle chips MCH1, MCH2, and MCH3 stacked on a base chip BCH in a zigzag shape, and an upper chip HCH. As an additional example, the base chip BCH, the plurality of middle chips MCH1, MCH2, and MCH3, and the upper chip HCH may be misaligned with one another.

The width (or length) of the base chip BCH may be W1. The size of the chip stacked semiconductor package 100 may be determined by the width (or length) of the base chip BCH. For example, the width (or length) of the first middle chip MCH1 and the third middle chip MCH3 may be W2 smaller than W1. The width (or length) of the second middle chip MCH2 may be W3 smaller than W1 and equal to W2. The width (or length) of the upper chip HCH may be W4 smaller than W1 and equal to W2 and W3. However, the present invention is not limited thereto. For example, the first middle chip MCH1, the second middle chip MCH2 and the upper chip HCH may each have different widths from each other.

In an exemplary embodiment of the present invention, the chip stacked semiconductor package 100 may be a high bandwidth memory (HBM) package or a hybrid memory cube (HMC) package. When the chip stacked semiconductor package 100 is configured as a high bandwidth memory (HBM) package or a hybrid memory cube (HMC) package, the base chip BCH may be a buffer chip or, a logic chip, and the middle chips MCH1, MCH2, and MCH3 may be memory chips.

In an exemplary embodiment of the present invention, when the base chip BCH is configured as a buffer chip, circuit elements such as transistors and capacitors are not formed, and only wiring layers connecting chips may be formed. In an exemplary embodiment of the present invention, when the base chip BCH is configured as a logic chip, logic circuit elements for driving and controlling each chip may also be included, including, for example, circuit elements such as transistors and capacitors, and wiring layers connecting the chips.

The base chip BCH may be a chip for stacking the middle chips MCH1, MCH2, and MCH3 and/or the upper chip HCH. The base chip BCH may be a lower chip in terms of the chip stacking position. For example, the base chip BCH may be a control chip. In other words, the base chip BCH may be a microcontroller (or, e.g., microprocessor) for driving or controlling the chip stacked semiconductor package 100. In an exemplary embodiment of the present invention, the base chip BCH, the middle chips MCH1, MCH2, and MCH3, and the upper chip HCH may be the same or different types of chips from each other. The upper chip HCH may have a thickness T1. In an exemplary embodiment of the present invention, the base chip BCH and the middle chips MCH1, MCH2, and MCH3 may have the same thickness as the upper chip HCH.

The first middle chip MCH1, the second middle chip MCH2, and the third middle chip MCH3, and the upper chip HCH stacked on the base chip BCH may be referred to as first to fourth chips, respectively. In this embodiment, three middle chips MCH1, MCH2, and MCH3 are shown as an example, but the present invention is not limited thereto.

For example, if only the first middle chip MCH1 is included among the middle chips MCH1, MCH2, and MCH3 in the chip stacked semiconductor package 100, the first middle chip MCH1 and the upper chip HCH may be referred to as a first chip and a second chip, respectively. When only the first middle chip MCH1 and the second middle chip MCH2 are included among the middle chips MCH1, MCH2, and MCH3 in the chip stacked semiconductor package 100 the first middle chip MCH1, the second middle chip MCH2, and the upper chip HCH may be referred to as first, second and third chips, respectively. Chips sequentially stacked on the base chip BCH as described above may be referred to as first to n-th chips (n is an integer).

The base chip BCH may include a base chip body 10 having a base front surface 10a and a base rear surface 10b. Both side surfaces of the base chip body 10 may be exposed surfaces BSDa and BSDb. Base connection pads 12 and 14 are formed on the base front surface 10a and the base rear surface 10b respectively. A protective layer 20 insulating the base connection pads 14 may be formed on the base rear surface 10b. A base through via T6 penetrating the base chip body 10 is provided between the base connection pads 12 and 14 formed on the base front surface 10a and the base rear surface 10b. An external connection member 18 electrically connected to the base through via 16 is formed on the base front surface 10a.

A first chip MCH1 or a first middle chip is stacked on the base rear surface 10b of the base chip BCH in an offset form. The first chip MCH1 may include a first chip body 30 having a first front surface 30a and a first rear surface 30b opposite to the first front surface 30a. The first chip MCH1 is stacked on the base chip BCH by moving in a first offset direction (e.g., -X direction) to a first offset distance OF1.

Accordingly, the first chip MCH1 may include a first chip body 30 having a first exposed surface SD1a, which is exposed, and a first non-exposed surface SD1b opposite to the first exposed surface SD1a. The first offset distance OF1 of the first chip MCH1 may be a distance from the exposed surface BSDb of one side of the base chip BCH to the first non-exposed surface SD1b of the first chip MCH1.

In the first chip MCH1, first connection pads 32 and 34 are formed on the first redistribution layer 40 of the first front surface 30a and the first rear surface 30b, respectively. A first through via 36 penetrating the first chip body 30 is formed between the first connection pads 32 and 34, for example, between the first front surface 30a and the first rear surface 30b. The first redistribution layer 40 may be formed on the first front surface 30a. Chip pads formed on the first chip body 30 can be rewired due to the first redistribution layer 40. In an exemplary embodiment of the present invention, another redistribution layer may be formed on the first rear wart is 30b.

The first chip MCH1 has a first connection member 38 electrically connected to the base through via 16 through the base connection pad 14. A first underfill layer 42 is formed between the base rear surface 10b of the base chip BCH and the first front surface 30a of the first chip MCH1. A first molding layer 44 is formed on the base rear surface 10b of the base chip BCH and to be in contact with the first non-exposed surface SD1b facing the first exposed surface SD1a.

A second chip MCH2 or a second middle chip is stacked in an offset form on the first rear surface 30b of the first chip MCH1. The second chip MCH2 may include a second chip body 50 having a second front surface 50a and a second rear surface 50b opposite to the second front surface 50a. The second chip MCH2 is stacked on the first chip MCH1 by moving in a second offset direction (e.g., +X direction) to a second offset distance OF2.

Accordingly, the second chip MCH2 may include a second chip body 50 having a second exposed surface SD2a, which is exposed, and a second non-exposed surface SD2b opposite to the second exposed surface SD2a. The second offset distance OF2 may be a distance from the first exposed surface SD1a of the first chip MCH1 to the second non-exposed surface SD2b of the second chip MCH2. In the second chip MCH2, one set of second connection pads 52 are formed on the second redistribution layer 60 and the second front surface 50a, and another set of second connection pads 54 are formed on the second rear surface 50b. A second through via 56 penetrating the second chip body 50 is formed between the second connection pads 52 and 54, that is, between the second front surface 50a and the second rear surface 50b. A second redistribution layer 60 may be formed on the second front surface 50a. Chip pads formed on the second chip body 50 may be rewired due to the second redistribution layer 60.

The first chip MCH1 has a first connection member 58 electrically connected to the base through via 16 through a first through via electrically connected to a first connection pad 32 that is electrically connected to the base connection pad 14. A second underfill layer 62 is formed between the first rear surface 30b of the first chip MCH1 and the second front surface 50a of the second chip MCH2. A second molding layer 64 is formed on the first rear surface 30b of the first chip MCH1 in contact with the second non exposed surface SD2b facing the second exposed surface SD2a.

A third chip MCH3 or a third middle chip is stacked in an offset form on the second rear surface 50b of the second chip MCH2. The third chip MCH3 may include a third chip body 70 having a third front surface 70a and a third rear surface 70b opposite to the third front surface 70a. The third chip MCH3 is stacked on the third chip MCH2 by moving in the first offset direction (e.g., –X direction) to the first offset distance OF1.

Accordingly, the third chip MCH3 may include a third chip body 70 having a third exposed surface SD3a, which is exposed, and a third non-exposed surface SD3b facing the third exposed surface SD3a. The first offset distance OF1 of the third chip MCH3 may be the same as the offset distance OF1 of the first chip MCH1 mentioned above. The first offset distance OF1 of the third chip MCH3 may be a distance from the second exposed surface SD2a of the second chip MCH2 to the third non-exposed surface SD3b of the third chip MCH3.

In the third chip MCH3, third connection pads 72 and 74 are formed on the third redistribution layer 80 of the third front surface 70a and the third rear surface 70b, respectively. A third through via 76 penetrating the third chip body 70 is formed between the third connection pads 72 and 74, that is, between the third front surface 70a and the third rear surface 70b. A third redistribution layer 80 may be formed on the third front surface 70a. Chip pads formed on the third chip body 70 may be freely rewired due to the third redistribution layer 80.

The third chip MCH3 has a third connection member 78 electrically connected to the second through via 56 through a second connection pad 54. A third underfill layer 82 is formed between the second rear surface 50b of the second chip MCH2 and the third front surface 70a of the third chip MCH3. A third molding layer 84 is formed on the second rear surface 50b of the second chip MCH2 and to be in contact with the third non-exposed surface SD3b facing the third exposed surface SD3a.

A fourth chip HCH or an upper chip is stacked on the third rear surface 70b of the third chip MCH3 in an offset form. The fourth chip HCH may include a fourth chip body 90 having a fourth front surface 90a and a fourth rear surface 90b opposite to the fourth front surface 90a. The fourth rear surface 90b may be exposed as the upper surface FS1 of the fourth chip HCH. The fourth chip HCH is stacked on the third chip MCH3 in the second offset direction (e.g., +X direction) h moving from the third exposed surface SD3a and the third non-exposed surface SD3b of the third chip MCH3 to the third offset distance OF3. A fourth redistribution layer 98 may be formed on the fourth front surface 90a of the fourth chip HCH. The fourth chip HCH has a fourth connection pad 92 thrilled on the fourth redistribution layer 98 on the fourth front surface 90a. Chip pads formed on the fourth chip body 90 can be freely rewired due to the fourth redistribution layer 98. The fourth chip HCH includes a fourth connection member 94 electrically connected to the third through via 76 through the fourth connection pad 92 and the third connection pad 74. A fourth underfill layer 99 is formed between the third rear surface 70b of the third chip MCH3 and the fourth front surface 90a of the fourth chip HCH. Third molding layers 84 are formed on both sides of the fourth chip HCH. For example, the third molding layer 84 may cover the fourth front surface 90a.

The fourth chip HCH may include fourth non-exposed surfaces SD4a and SD4b that are not exposed by the third molding layer 84 and the fourth molding layer 96.

In an exemplary embodiment of the present invention, the base connection pads 12 and 14, the first connection pads 32 and 34, the second connection pads 52 and 54, the third connection pads 72 and 74, and the fourth connection pad 92 may be referred to as bump pads made of a conductive material such as copper or aluminum. The external connection member 18, the first connection member 38, the second connection member 58, the third connection member 78, and the fourth connection member 94 may be referred to as a bump made of a conductive material such as copper, aluminum, gold, or solder material.

In an exemplary embodiment of the present invention, the first to fourth underfill layers 42, 62, 82, and 99 and the first to fourth molding layers 44, 64, 84, and 96 are separately illustrated in FIG. 1 but the first to fourth underfill layers 42, 62, 82, and 99 and the first to fourth molding layers 44, 64, 84, and 96 may be formed of one material layer. For example, first to fourth underfill layers 42, 62, 82, and 99 and the first to fourth molding layers 44, 64, 84, and 96 may be the same material as each other or may be a different from each other.

In an exemplary embodiment of the present invention, the first to fourth underfill layers 42, 62, 82, and 99 may be formed of, for example, an epoxy resin, or may be formed of a silica filler or a flux. The first to fourth molding layers 44, 64, 84, and 96 may be formed of, for example, an epoxy resin.

In relation to the chip stacked semiconductor package 100 described above, both sides BSDa and BSDb of the base chip BCH are exposed, the first to third exposed surfaces SD1a, SD2a, SD3a are provided on one sides of the middle chips MCH1, MCH3, respectively, and the fourth rear surface 90b(FS1) of the upper chip HC is exposed. Accordingly, in relation to the chip stacked semiconductor package 100, reliability can be increased by easily discharging heat generated from each Chip through both side surfaces BSDa and BSDb of the base chip BCH, the first to third exposed surfaces SD1a, SD2a, and SD3a of the middle chips MCH1, MCH2, and MCH3, and the fourth rear surface 90b (FS1) of the upper chip HCH.

Figure 3:
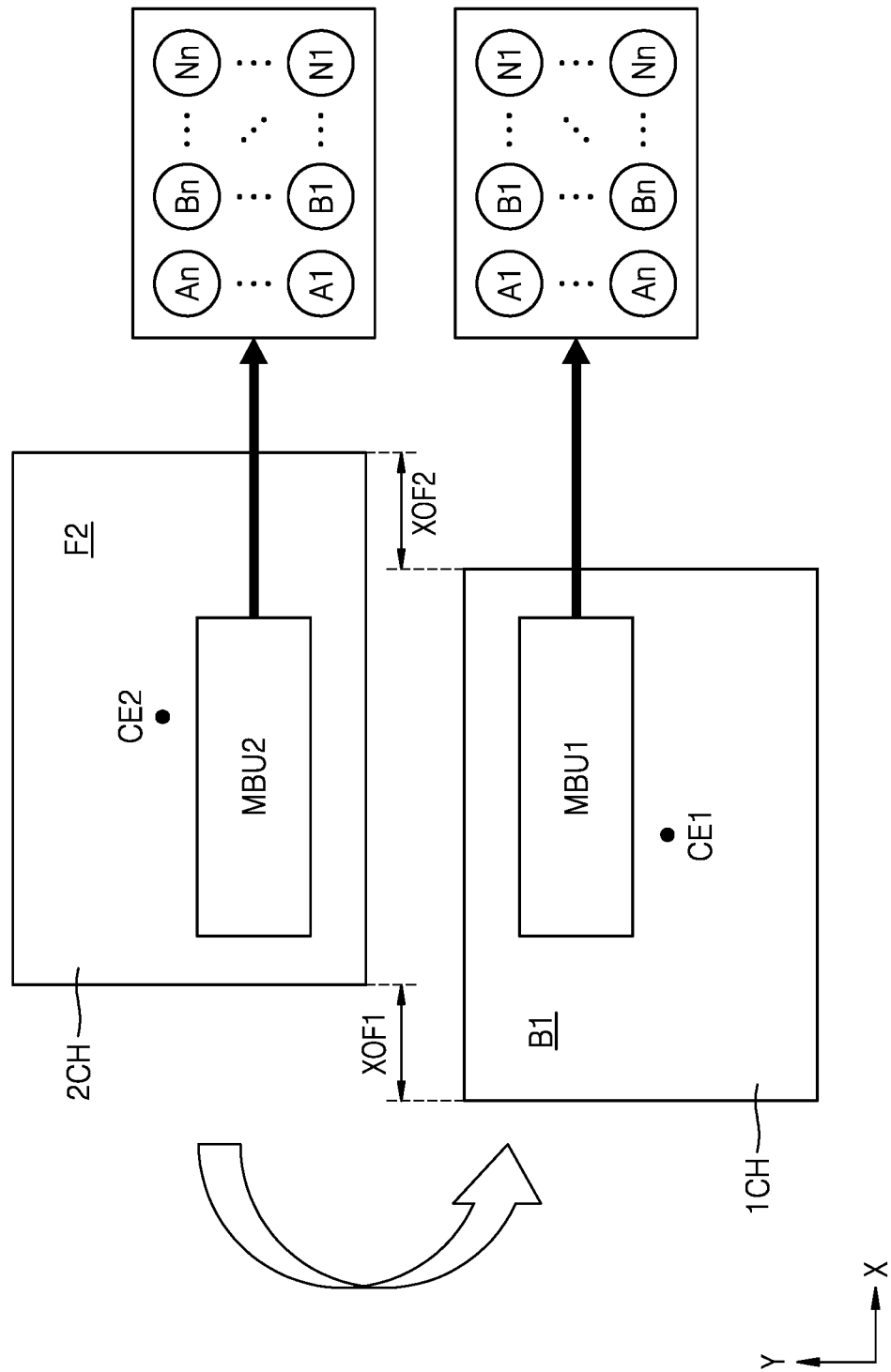
FIG. 3 is a plan view illustrating a process of stacking chips constituting a chip-stacked semiconductor package according to an exemplary embodiment of the present invention.

FIG. 3 is a plan view illustrating a stacking process of chips constituting a chip stacked semiconductor package according to an exemplary embodiment of the present invention.

For example, the chip stacked semiconductor package according to an exemplary embodiment of the present invention includes stacking the second chip 2CH on the first chip 1CH in an offset form. For example, the second chip 2CH is misaligned with the first chip 1CH. The first chip 1CH may be a chip positioned at a lower part, and the second chip 2CH may be a chip positioned on the first chip 1CH. For example, the first chip 1CH may be the first middle chip MCH1 of FIG. 1, and the second chip 2CH may be the second middle chip MCH2 of FIG. 1.

In the first chip 1CH, a first through-via formation area MBU1 may be moved from the center CE1 of the first chip body to one side of the first chip 1CH. The first through-via formation area MBU1 may be referred to as a first connection member formation area. A plurality of first through vias A1-An, B1-Bn . . . N1-Nn (where n is a positive integer) that are spaced apart from each other may be located in the first through-via formation area MBU1.

In the second chip 2CH, a second through-via formation area MBU2 may be moved from the center CE2 of the second chip body to one side of the second chip 2CH. The second through via formation area MBU2 may be referred to as a second connection member formation area. The second through-via formation area MBU2 may be disposed in a mirror symmetric shape with respect to the first through-via formation area MBU1.

A plurality of second through vias An-A1, BD-B1 . . . Nn-N1 (where a is a positive integer) that are spaced apart from each other ma be located in the second through-via formation area MBU2. The second through vias An-A1, Bn-B1 . . . Nn-N1 (where n is a positive integer) may be disposed in a mirror symmetric shape with the first through vias A1-An, B1-Bn . . . N1-Nn (where n is a positive integer). For example, the second through vias An-A1, Bn-B1 . . . Nn-N1 may have a similar arrangement as that of the first through vias A1-An, B1-Bn . . . N1-Nn.

The second chip 2CH is stacked upside down on the first chip 1CH and offset from one side of the first chip CB1 in the +X direction (second offset direction) to the offset distances XOF1 and XOF2. Accordingly, the second front surface F2 of the second chip 2CH may be stacked on the first rear surface B1 of the first chip 1CH. In FIG. 3, it is illustrated that the second chip 2CH is stacked on the first chip 1CH in an offset form in the +X direction (second offset direction) but the second chip 2CH may also be stacked in an offset form in the −X direction (first offset direction), −Y direction (third offset direction), and/or +Y direction (fourth offset direction).

FIGS. 4 to 7 are cross-sectional views of main parts illustrating a method of manufacturing the chip stacked semiconductor package of FIG. 1.

For example, in FIGS. 4 to 7, the same reference numerals as in FIG. 1 denote the same members. In FIGS. 4 to 7, the contents described with reference to FIG. 1 may be briefly described or omitted.

Figure 4:
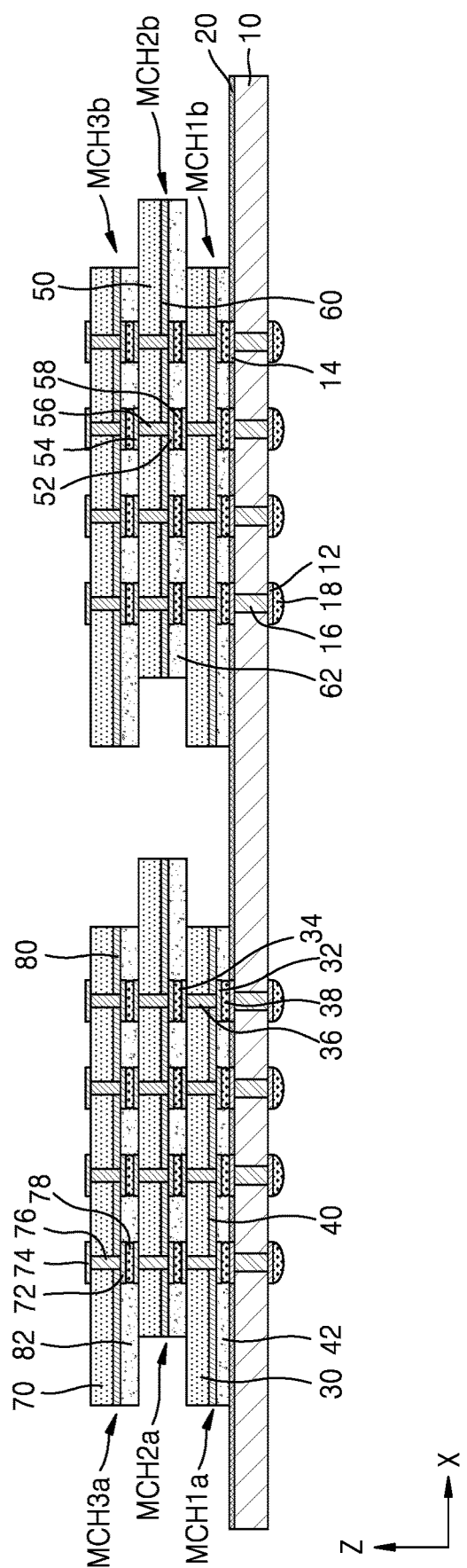
FIGS. 4, 5, 6 and 7 are cross-sectional views of main pans illustrating a method of manufacturing a chip-stacked semiconductor package according to an exemplary embodiment of the present invention.

Referring to FIG. 4 a base chip body 10 is prepared. The base chip body 10 may include base connection pads 12 and 14, a base through via 16, an external connection member 18, and a protective layer 20. For example, the base chip body 10 may be a wafer, such as a silicon wafer.

First chips MCH1a and MCH1b, or first middle chips that are disposed spaced apart from each other are stacked on the base chip body 10. The first chips MCH1a and MCH1b include a first chip body 30, first connection pads 32 and 34, a first through via 36, a first connection member 38, and a first redistribution layer 40. The first connection member 38 of the first chips MCH1a and MCH1b may be electrically connected to the base connection pad 14. A first underfill layer 42 may be formed between the first chips MCH1a and MCH1b and the protective layer 20 of the base chip body 10.

Second chips MCH2a and MCH2b, or second middle chips are stacked on the first chips MCH1a and MCH1b through offsetting in the +X direction (e.g., the second offset direction). The second chips MCH2a and MCH2b include a second chip body 50, second connection pads 52 and 54, a second through via 56, a second connection member 58, and a second redistribution layer 60. The second connection member 58 of the second chips MCH2a and MCH2b may be electrically connected to the first connection pad 34. A second underfill layer 62 may be formed between the second chips MCH2a and MCH2b and the first chips MCH1a and MCH1b.

Third chips MCH3a and MCH3b, or third middle chips are stacked on, the second chips MCH2a and MCH2b through offsetting in the −X direction (e.g., the first offset direction). The third chips MCH3a and MCH3b include a third chip body 70, third connection pads 72 and 74, a third through via 76, a third connection member 78, and a third redistribution layer 80. The third connection member 78 of the third chips MCH3a and MCH3b may be electrically connected to the second connection pad 54 of the second chips MCH2a and MCH2b. A third underfill layer 82 may be formed between the third chips MCH3a and MCH3b and the second chips MCH2a and MCH2b.

Figure 5:
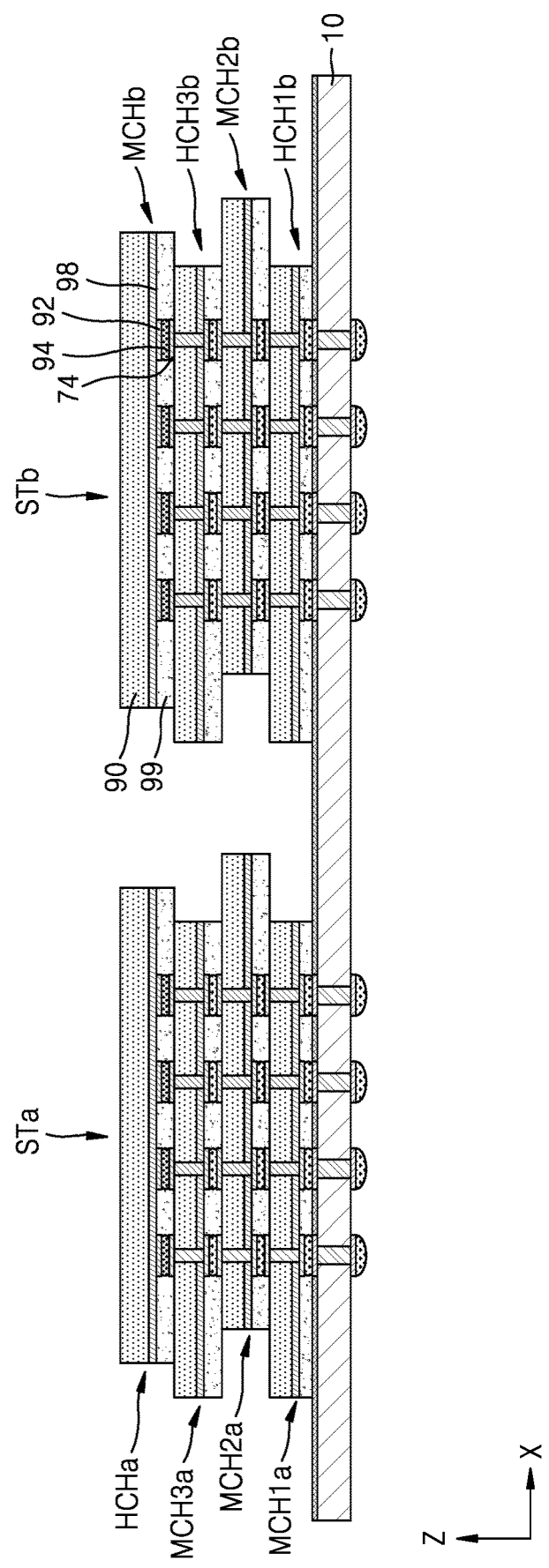

Referring to FIG. 5, fourth chips HCHa and HCHb, or upper chips are stacked on the third chips MCH3a and MCH3b through offsetting in the X direction (e.g., the second offset direction), respectively. The fourth chips HCHa and HCHb may include a fourth chip body 90, a fourth connection pad 92, a fourth connection member 94, and a fourth redistribution layer 98. The fourth connection member 94 of the fourth chips HCHa and HCHb may be electrically connected to the third connection pad 74 of the third chips MCH3a and MCH3b. A fourth underfill layer 99 may be formed between the fourth chips HCHa and HCHb and the third chips MCH3a and MCH3b.

In this case, stacked structures STa and STb, which include first to fourth chips MCH1a, MCH1b, MCH2a, MCH2b, MCH3a, MCH3b, HCHa, and HCHb stacked on the base chip body 10 in an offset form, may be formed. The stacked structures STa and STb way include a first stacked structure STa including first to fourth chips MCH1a, MCH2a, MCH3a, and HCHa, and a second stacked structure STb may include first to fourth chips MCH1b, MCH2b, MCH3b, and HCHb. The first stacked structure STa and the second stacked structure STb may be located spaced apart from each other.

Figure 6:
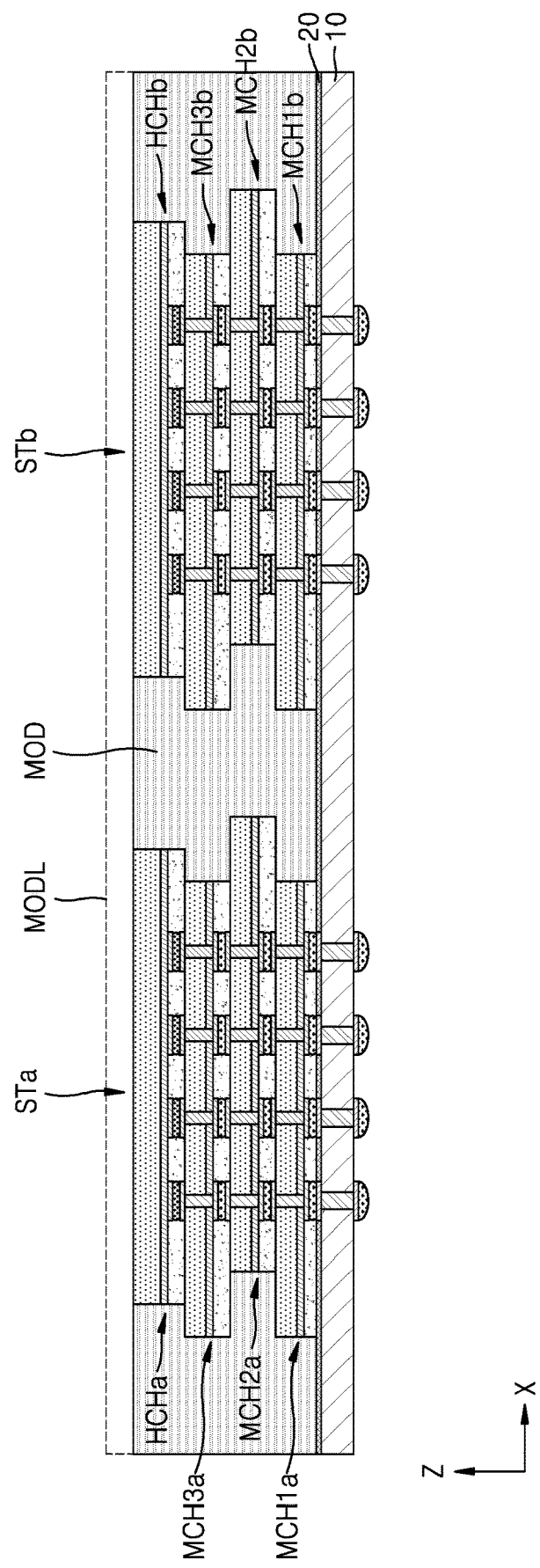

Referring to FIG. 6, a molding layer MOD is formed on the base chip body 10 to cover the stacked structures STa and STb which include first to fourth chips MCH1a, MCH1b, MCH2a, MCH2b, MCH3a, MCH3b, HCHa, and HCHb stacked in an offset form. The molding layer MOD may be formed by forming the molding material layer MODL to cover the stacked structures STa and STb, and then flattening the surfaces of the fourth chips HCHa and HCHb as an etch stop point. The molding layer MOD may be formed between the stacked structures STa and STb on the base chip body 10, and between and/or on both sides of the first to fourth chips MCH1a, MCH1b, MCH2a, MCH2b, MCH3a, MCH3b, HCHa, and HCHb constituting the stacked structures STa and STb. For example, the molding layer MOD may be disposed between the first chips MCH1a and MCH1b, and may cover opposing sides of each first chip MCH1a and MCH1b.

Figure 7:
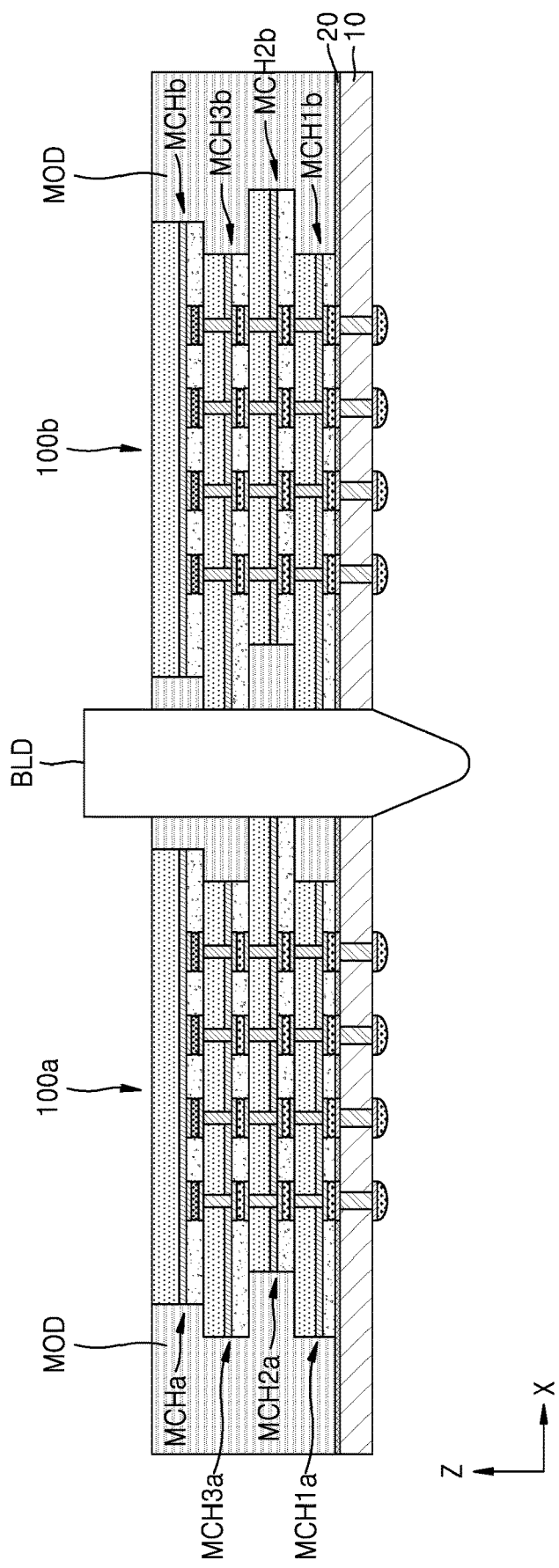

Referring to FIG. 7, the chip stacked semiconductor packages 100a and 100b are completed by cutting the molding layer MOD between the stacked structures STa and STb with blades BLD. After cutting, the molding layer MOD may correspond to the first molding layer 44, the second molding layer 64, the third molding layer 64, and the fourth molding layer 96. The structure of each of the chip stack packages 100a and 100b has been described above with reference to FIG. 1 and thus will be omitted.

Figure 8:
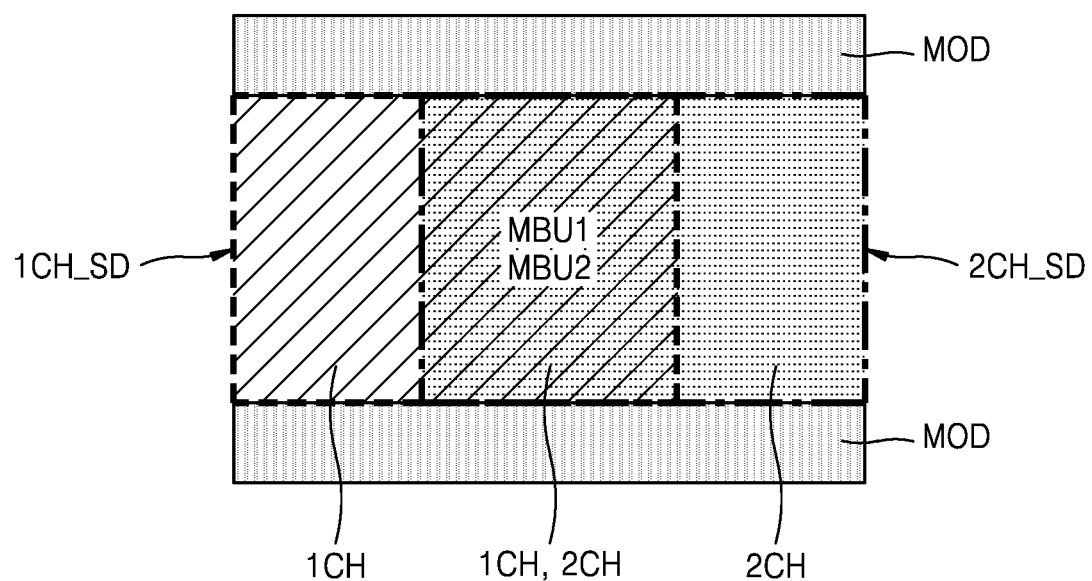
FIGS. 8, 9 and 10 are stacked layout diagrams according to an offset type of chips constituting a chip-stacked semiconductor package according to an exemplary embodiment of the present invention.
Figure 9:
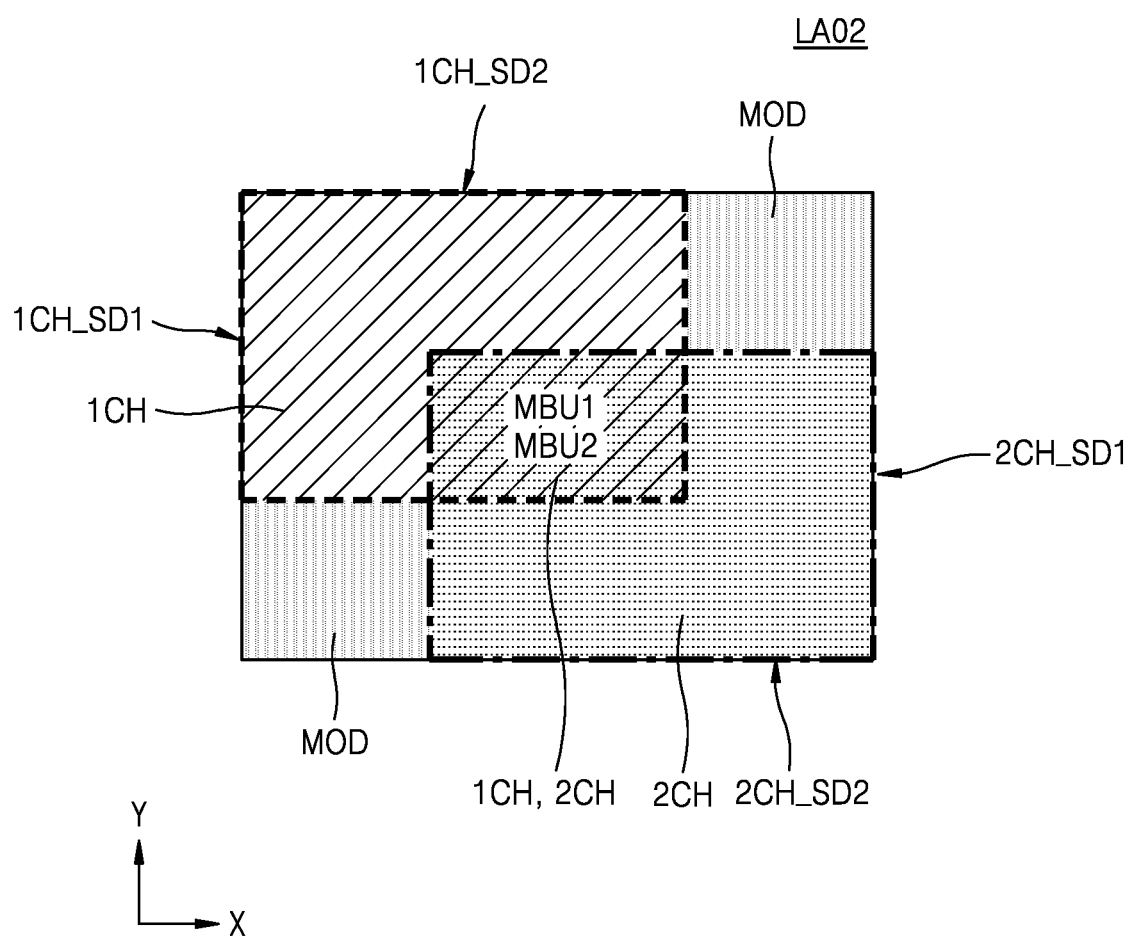
Figure 10:
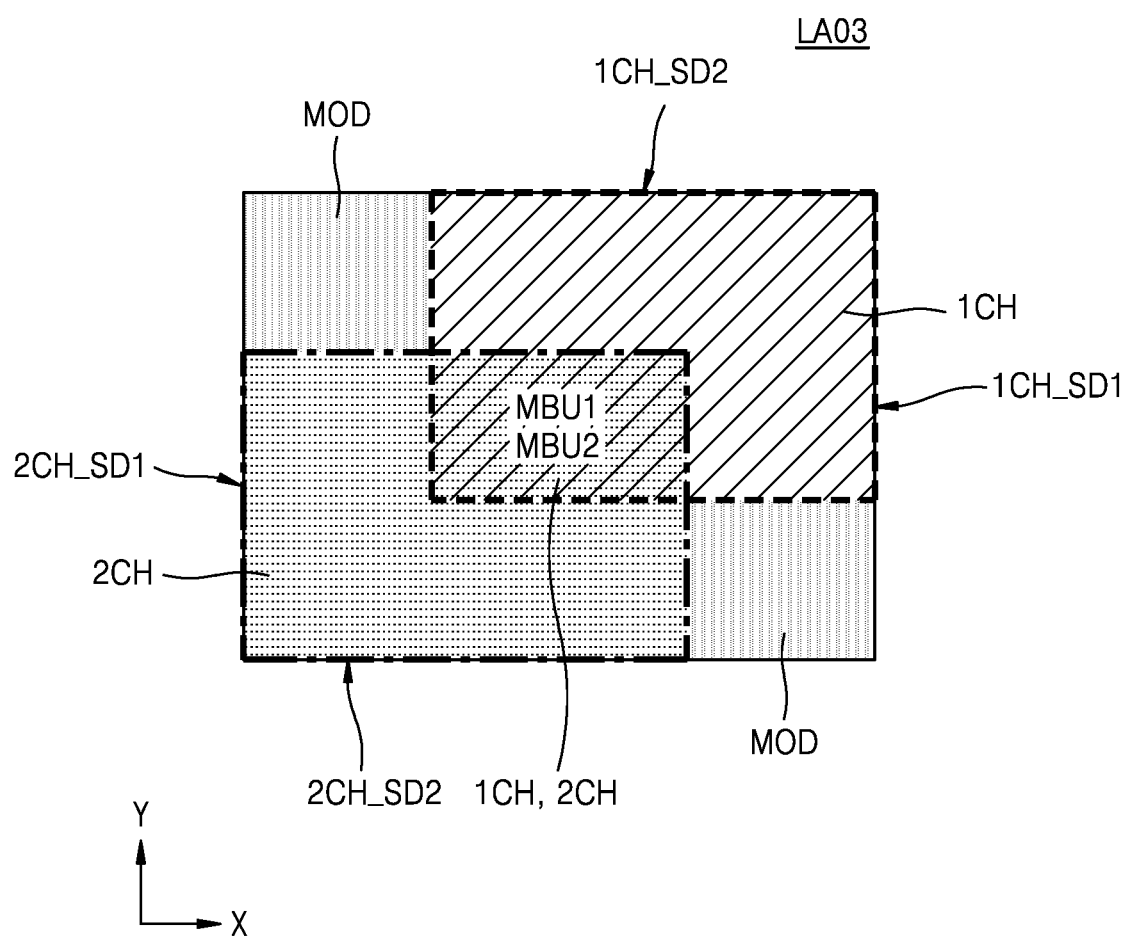

FIGS. 8 to 10 are stacked layout diagrams according to an offset type of chips constituting a chip stacked semiconductor package according to an exemplary embodiment of the present invention.

For example, in FIGS. 8 to 10, the same reference numerals as in FIG. 3 may denote the same members. As described with reference to FIG. 3, in the chip stacked semiconductor package according to an exemplary embodiment of the present invention, the second chip 2CH is stacked on the first chip 1CH in an offset form. The first chip 1CH may, be a chip positioned at a lower part, and the second chip 2CH may be a chip positioned on the first chip 1CH. For example, the first chip 1CH may be the first middle chip MCH1 of FIG. 1, and the second chip 2CH may be the second middle chip MCH2 of FIG. 1. The first chip 1CH and the second chip 2CH may each include a first through-via formation area MBU1 and a second through-via formation area MBU2.

The stacking layout LAO1 of FIG. 8 is stacked by offsetting the second chip CH2 on the first chip CH1 in the +X direction (second offset direction). Accordingly, the first through-via formation area MBU1 of the first chip CH1 may overlap the second through-via formation area of the second chip CH2 in the central portion. A first exposed surface 1CH_SD may be disposed on one side of the first chip CH1, and a second exposed surface 2CH_SD may be disposed on one side the second chip CH2 on a side opposite to the first exposed surface 1CH_SD.

The molding layer MOD may be located in a portion where the first chip CH1 and the second chip CH2 are not formed. One of the four side surfaces of the first chip CH1 may be an exposed surface 1CH_SD. One of the four side surfaces of the second chip CH2 may be an exposed surface 2CH_SD.

The stacking layout LAO2 of FIG. 9 is stacked on the first chip CH1 by offsetting the second chip CH2 in the +X direction (the second offset direction) and the −Y direction (the third offset direction). The stacking layout LAO3 of FIG. 10 is stacked on the first chip CH1 by offsetting the second chip CH2 in the −X direction (the first offset direction) and the −Y direction (the third offset direction).

Accordingly, the first through-via formation area MBU1 of the first chip CH1 may overlap the second through-via formation area MBU2 of the second chip CH2 in the central portion. First exposed surfaces 1CH_SD1 and 1CH_SD2 may be disposed on one side of the first chip CH1. In addition, the first exposed surfaces 1CH_SD1 and 1CH_SD2 may be disposed on one side of the second chip CH2, and the second exposed surfaces 2CH_SD1 and 2CH_SD2 may be disposed on the opposite side of the second chip CH2.

The molding layer MOD may be located in a portion where the first chip CH1 and the second chip CH2 are not formed. In the first chip CH1, two of the four side surfaces may be exposed surfaces 1CH_SD1 and 1CH_SD2 by the molding layer MOD. In the second chip CH2, two of the four side surfaces may be exposed surfaces 2CH_SD1 and 2CH_SD2 by the molding layer MOD.

As described above, in the chip stacked semiconductor package according to an exemplary embodiment of the present invention, one or two of the four side surfaces of the first chip CH1 and the second chip CH2 may be exposed according to the offset shape of the chips.

Figure 11:
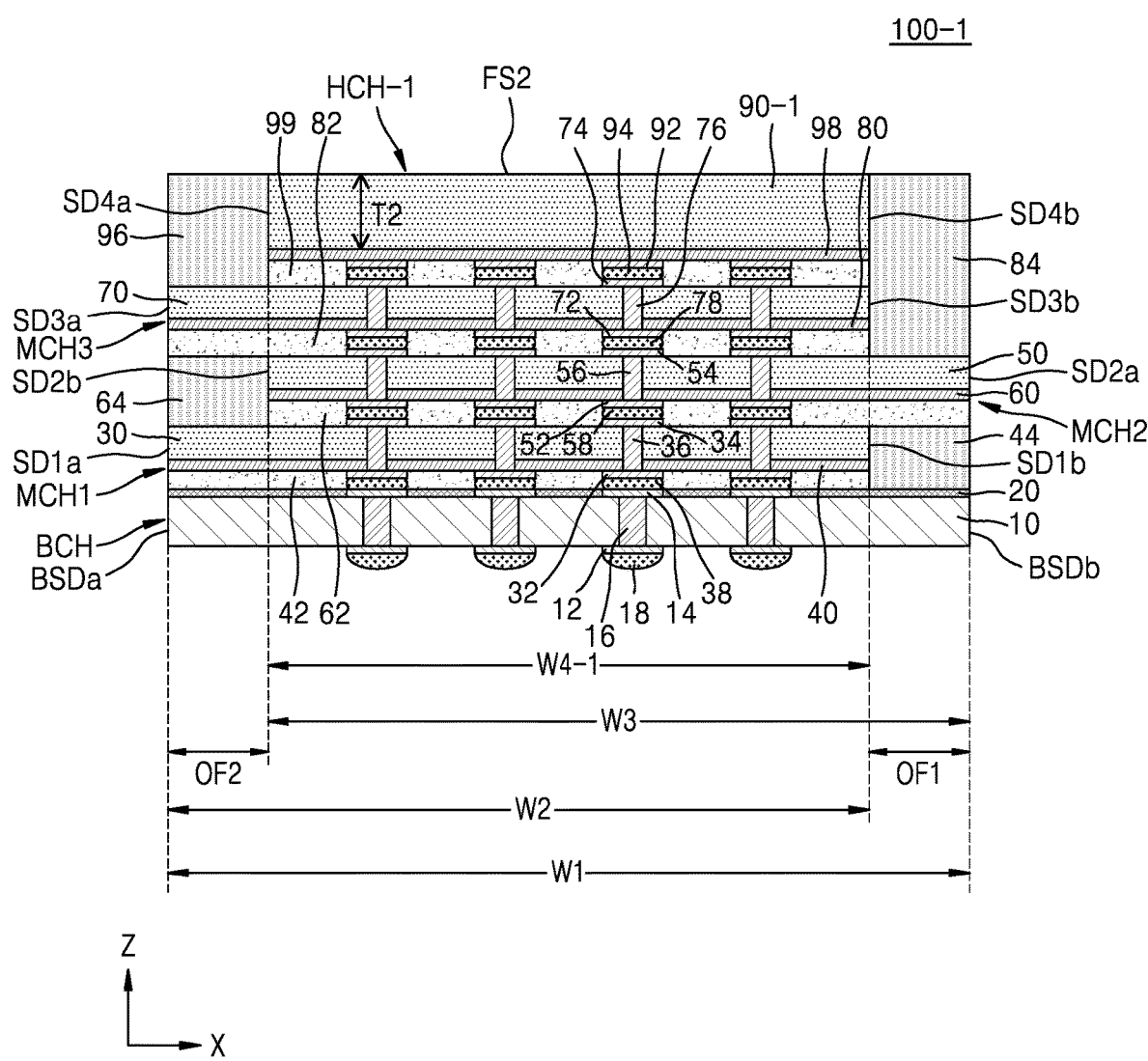
FIG. 11 is a cross-sectional view of a main part of a chip-stacked semiconductor package according to an exemplary embodiment of the present invention.

FIG. 11 is a cross-sectional view of a main part of a chip stacked semiconductor package according to an exemplary embodiment of the present invention.

For example, when compared with the chip stacked semiconductor package 100 of FIG. 1, the chip stacked semiconductor package 100-1 of FIG. 11 may be the same except that the width W4-1 and the thickness T2 of the upper chip HCH or a fourth chip are different from that of the chip stack semiconductor package 100 of FIG. 1. In FIG. 11, the same reference numerals as in FIG. 1 denote the same members. In FIG. 11, the contents described in FIG. 1 will be briefly described or omitted.

The chip stacked semiconductor package 100-1 may include a base chip BCH or a lower chip, a plurality of middle chips MCH1, MCH2, and MCH3, or first to third chips, and an upper chip HCH-1. The width (or length) of the upper chip HCH-1 may be W4-1, which is smaller than the width W1 of the base chip BCH and the widths W2 and W3 of the middle chips MCH1, MCH2, and MCH3. The upper chip HCH-1 may be disposed on the third middle chip MCH3 while being offset from one side of the third middle chip MCH3.

The upper chip HCH-1 may be stacked by moving from one side surface of the third middle chip MCH3, that is, the third exposed surface SD3a, to the second offset distance OF2. The second offset distance OF2 of the upper chip HCH-1 may be the same as the second offset distance OF2 of the second middle chip MCH2. The fourth non-exposed surface SD4b of the upper chip HCH-1 may be flush or aligned with the third non exposed surface SD3b of the third middle chip MCH3 in a vertical direction. In addition, the thickness T2 of the upper chip HCH-1 may be greater than the thickness T1 of the upper chip HCH of FIG. 1.

The chip stacked semiconductor package 100-1 may have various offset arrangements by adjusting the size of the upper chip HCH-1 disposed on the third middle chip MCH3. In addition, when the thickness of the upper chip HCH-1 is relatively thick, heat can be more easily discharged through the upper surface FS2 of the chip body 90-1.

Figure 12:
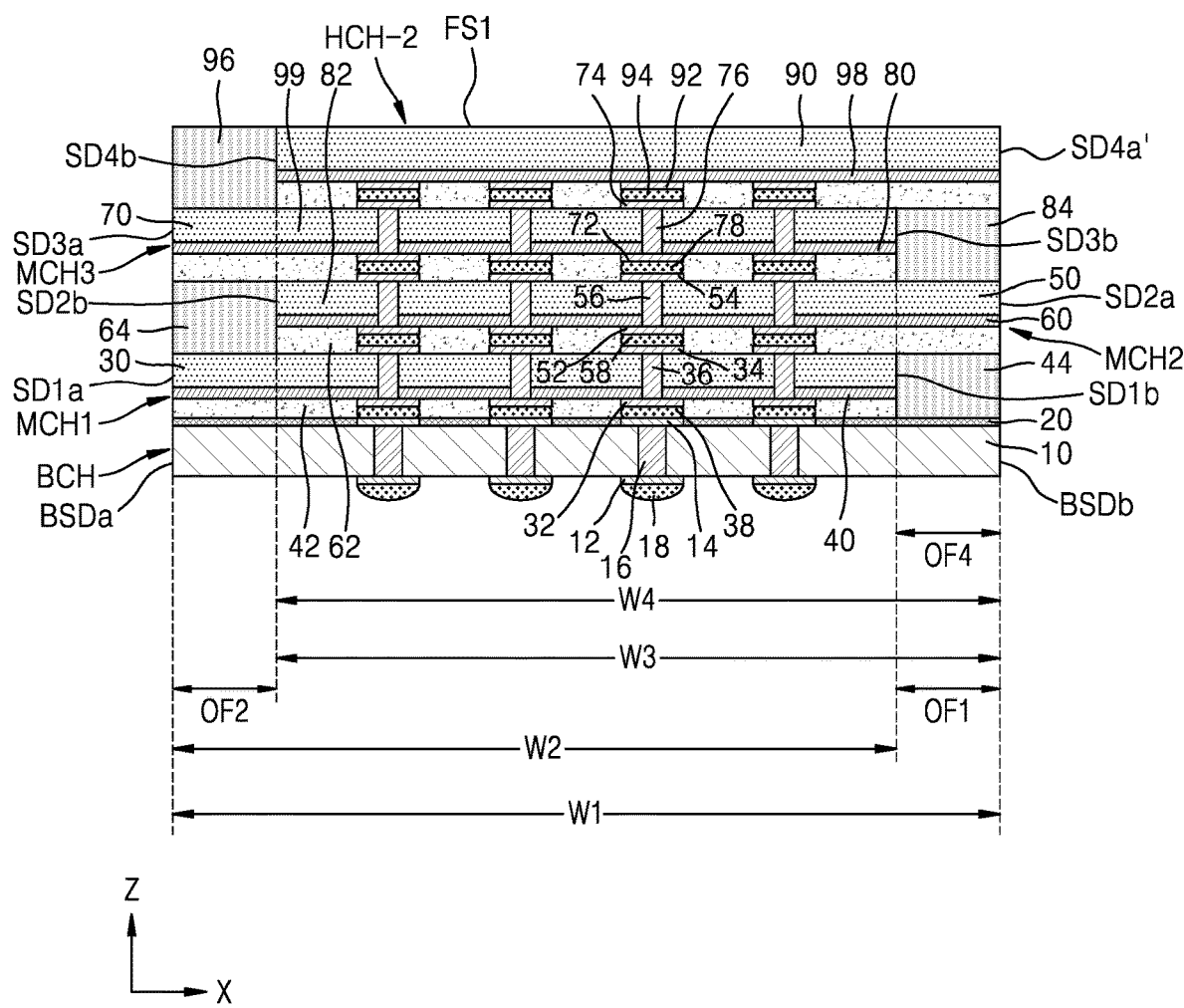
FIG. 12 is a cross-sectional view of a main part of a chip-stacked semiconductor package according to an exemplary embodiment of the present invention.

FIG. 12 is a cross-sectional view of a main part of a chip stacked semiconductor package according to an exemplary embodiment of the present invention.

For example, when compared with the chip stacked semiconductor package 100 of FIG. 1, the chip stacked semiconductor package 100-2 may be the same except that the offset distance OF2 of the upper chip HCH-2 or a fourth chip stacked on the third middle chip MCH3, or a third chip is different from that of chip stacked semiconductor package 100-2. In FIG. 12, the same reference numerals as in FIG. 1 denote the same members. In FIG. 12, the contents described in FIG. 1 will be briefly described or omitted.

The chip stacked semiconductor package 100-2 may include a base chip BCH or a lower chip, a plurality of middle chips MCH1, MCH2, and MCH3, or first to third chips, and an upper chip HCH-2. The width (or length) W4 of the upper chip HCH-2 may be smaller than the width W1 of the base chip BCH. The upper chip HCH-2 may be offset from one side of the third middle chip MCH3 to a second offset distance OF2 and stacked on the third middle chip MCH3. The second offset distance OF2 of the upper chip HCH-2 may be the same as the second offset distance OF2 of the second middle chip MCH2.

In the upper chip HCH-2, one side surface may be the fourth exposed surf ace SD4a', and one side surface facing the fourth exposed surface SD4a' may be the fourth non-exposed surface SD4b. The chip stacked semiconductor package 100-2 may have various offset arrangements between the third middle chip MCH3 and the upper chip HCH-2, which is disposed on the third middle chip MCH3 or a third chip with an offset. Accordingly, the upper chip HCH-2 may discharge heat more easily through the fourth exposed surface SD4a' of the upper chip HCH-2.

Figure 13:
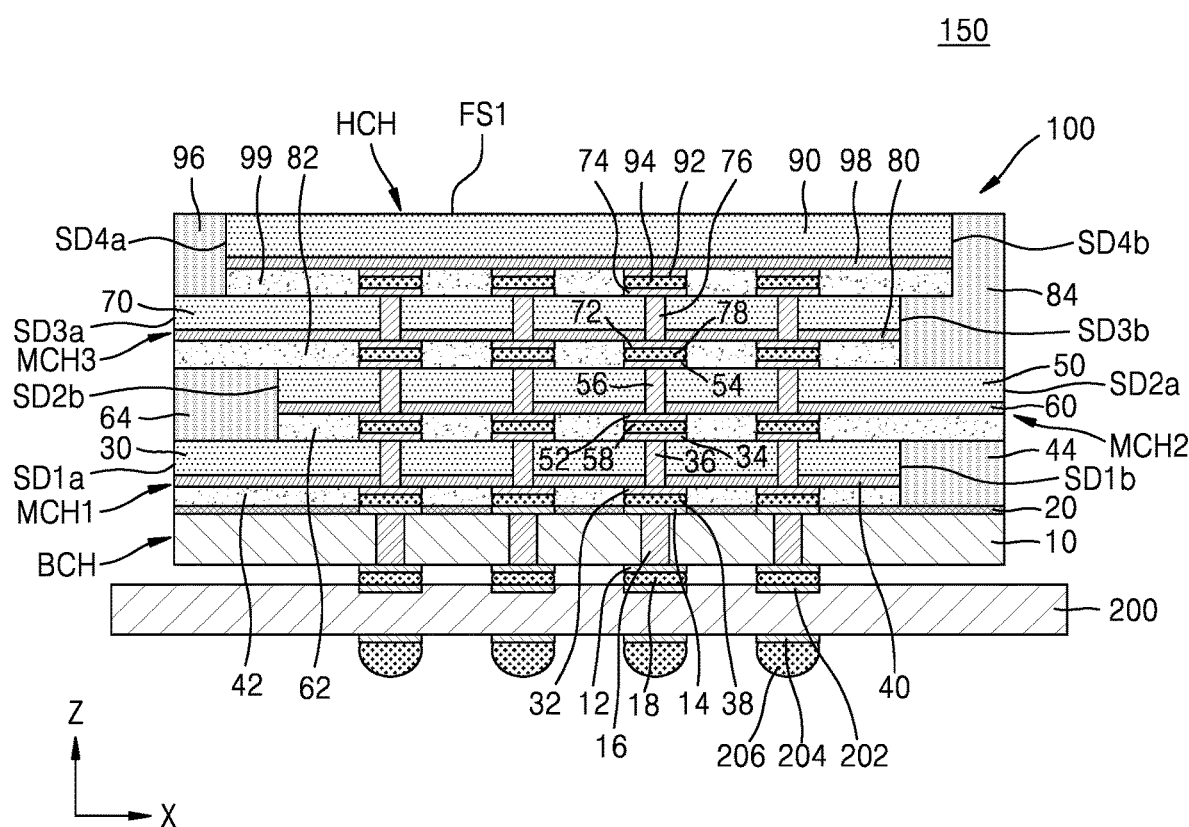
FIG. 13 is a cross-sectional view illustrating a chip-stacked semiconductor package according to an exemplary embodiment of the present invention.

FIG. 13 is a cross-sectional view illustrating a chip stacked semiconductor package according to an exemplary embodiment of the present invention.

For example, the chip stacked semiconductor package 150 may include a printed circuit board 200 or a board substrate and an upper semiconductor package 100. The upper semiconductor package 100 may be the same as the chip stacked semiconductor package 100 of FIG. 1. Accordingly, a description of each component of the upper package 100 will be omitted or briefly described. FIG. 13 illustrates the chip stacked semiconductor package 100 of FIG. 1 as an example of the upper semiconductor package 100, but the chip stacked semiconductor packages 100-1 and 100-2 described above may also be applied to the upper semiconductor package 100.

The upper semiconductor package 100 is stacked on the printed circuit board 200. The upper semiconductor package 100 may be electrically connected to the connection pad 202 of the printed circuit board 200 through an external connection member 18. A connection pad 202 and a connection member 204 are formed on the printed circuit board 200. For example, the connection pad 202 and the connection member 204 are each disposed on opposing sides of the printed circuit board 200.

Figure 14:
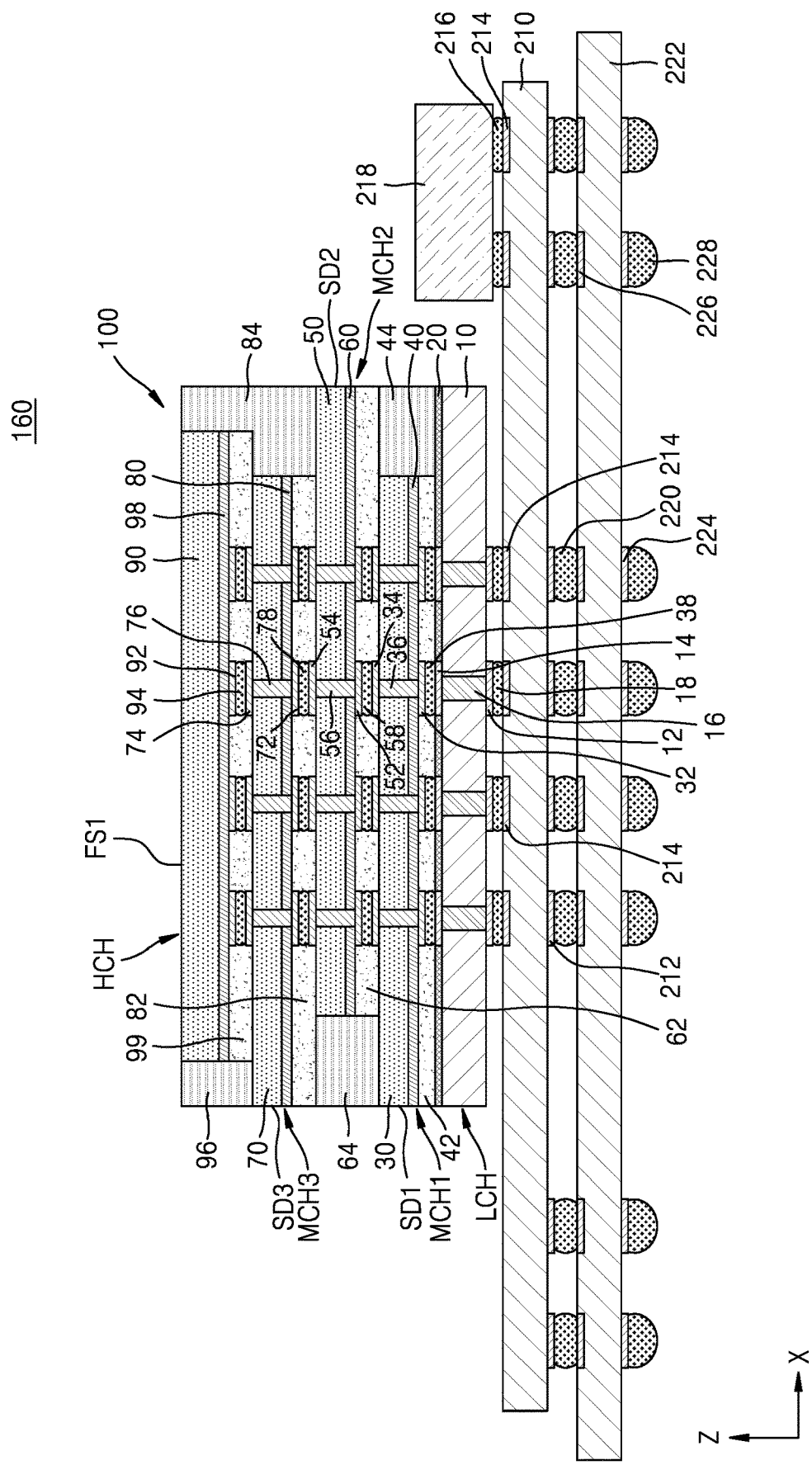
FIG. 14 is a cross-sectional view illustrating a chip-stacked semiconductor package according to an exemplary embodiment of the present invention.

FIG. 14 is a cross-sectional view illustrating a chip stacked semiconductor package according to an exemplary embodiment of the present invention.

For example, the chip stacked semiconductor package 160 may include a printed circuit board 220 or a board substrate, an interposer substrate 210, and an upper semiconductor package 100. The upper semiconductor package 100 may be the same as the chip stacked semiconductor package 100 of FIG. 1. Accordingly, a description of each component of the upper package 100 will be omitted or briefly described. FIG. 14 illustrates the chip stacked semiconductor package 100 of FIG. 1 as an example of the upper semiconductor package 100, but the chip stacked semiconductor packages 100-1 and 100-2 described above may also be applied to the upper semiconductor package 100.

The upper semiconductor package 100 is stacked on the interposer substrate 210. The upper semiconductor package 100 may be electrically connected to the middle connection pad 214 of the interposer substrate 210 through an external connection member 18. An additional semiconductor package 218 or an additional semiconductor chip may be mounted on the interposer substrate 210 to be spaced apart from the upper semiconductor package 100.

In an exemplary embodiment of the present invention, the additional semiconductor package 218 may be a power management chip package or a communication chip package. The additional semiconductor package 218 may be electrically connected to the connection pad 214 of the interposer substrate 210 through the connection member 216.

A connection pad 212 and a connection member 220 are formed on the lower surface of the interposer substrate 210. The connection member 220 of the interposer substrate 210 may be connected to the connection pad 226 of the printed circuit board 222. A connection pad 224 and a connection member 228 are formed on the lower surface of the printed circuit board 222.

FIGS. 15A to 15E are cross-sectional views illustrating a method of manufacturing a chip used in a chip stacked semiconductor pact age according to an exemplary embodiment of the present invention.

For example, FIGS. 15A to 15E may be used to manufacture the base chip BCH or the middle chips MCH1, MCH2 and MCH3 of the chip stacked semiconductor package 100 of FIG. 1. The manufacturing description of the chips of FIGS. 15A to 15E is illustrative and does not limit the present invention.

Figure 15A:
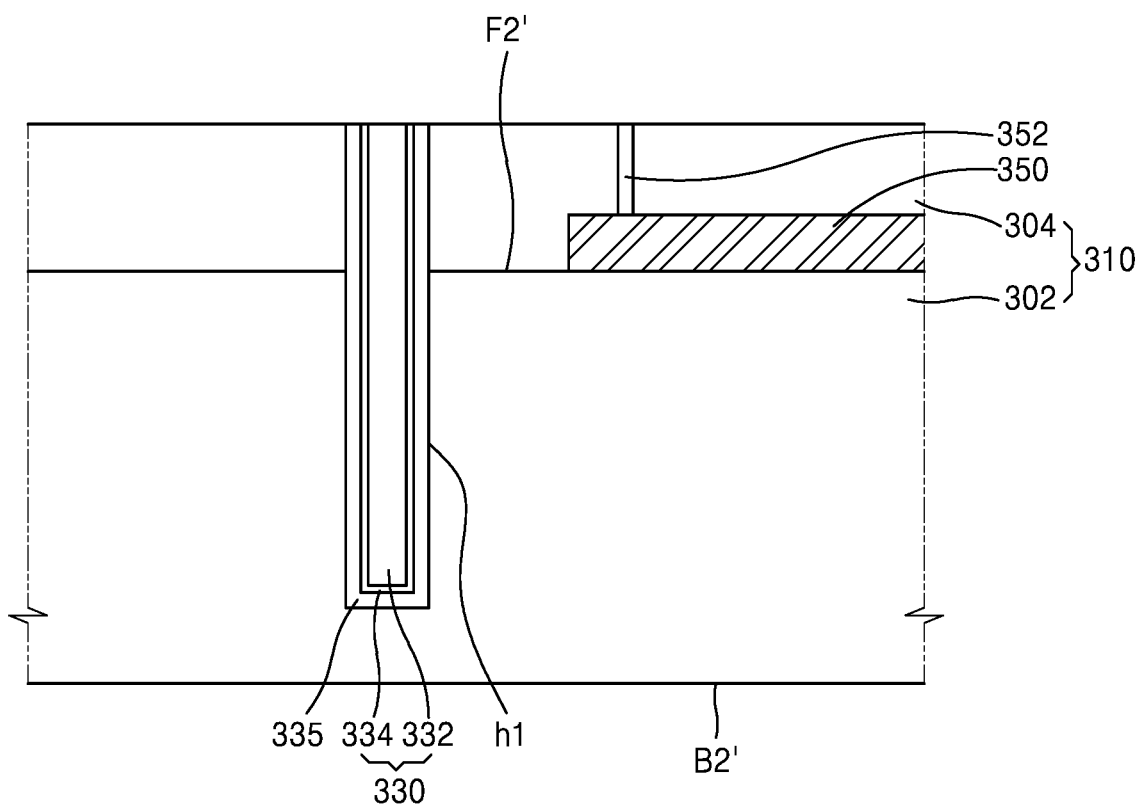
FIGS. 15A, 15B, 15C, 15D and 15E are cross-sectional views illustrating a method of manufacturing a chip used in a chip-stacked semiconductor package according to an exemplary embodiment of the present invention.

Referring to FIG. 15A, an integrated circuit layer 350 is formed on a front surface F2' of a semiconductor substrate 302, for example, a silicon substrate, and an interlayer insulating layer 304 covering the integrated circuit layer 350 is formed on the front surface F2' of the semiconductor substrate 302. The chip body 310 may include the semiconductor substrate 302 and the interlayer insulating layer 304.

A vertical plug 352 connected to the integrated circuit layer 350 may be formed in the interlayer insulating layer 304. The semiconductor substrate 302 may be formed of a single crystal wafer, such as a single crystal silicon wafer. The integrated circuit layer 350 may include various circuit elements, for example, transistors and/or capacitors, according to the type of chip.

After a trench h1 is formed in the interlayer insulating layer 304 and the semiconductor substrate 302, a spacer insulating layer 335 and a through via 330 are formed. The trench h1, which may be formed as a resist pattern, is formed in the interlayer insulating layer 304, and the interlayer insulating layer 304 and the semiconductor substrate 302 are continuously removed through an etching process using the resist pattern. For example, the trench hi may be formed using laser drilling.

As shown in the drawing, in consideration of polishing the rear surface B2' of the semiconductor substrate 302, the trench h1 may be formed so as not to penetrate the semiconductor substrate 302. In an exemplary embodiment of the present invention, the trench h1 may be formed through the semiconductor substrate 302. The shape of the trench h1 may have various shapes according to etching conditions or drilling conditions. For example, the trench h1 may have a relatively uniform cylindrical shape, or may have a shape whose width becomes narrower from top to bottom.

The through via 330 is formed of a barrier metal layer 334 and a wiring metal layer 332. The barrier metal layer 334 may include a stacked structure formed of one or more of Ti, Ta, TiN, and/or TaN. The wiring metal layer 332 may include a stacked structure formed of one or more of W, Al, and/or Cu.

Figure 15B:
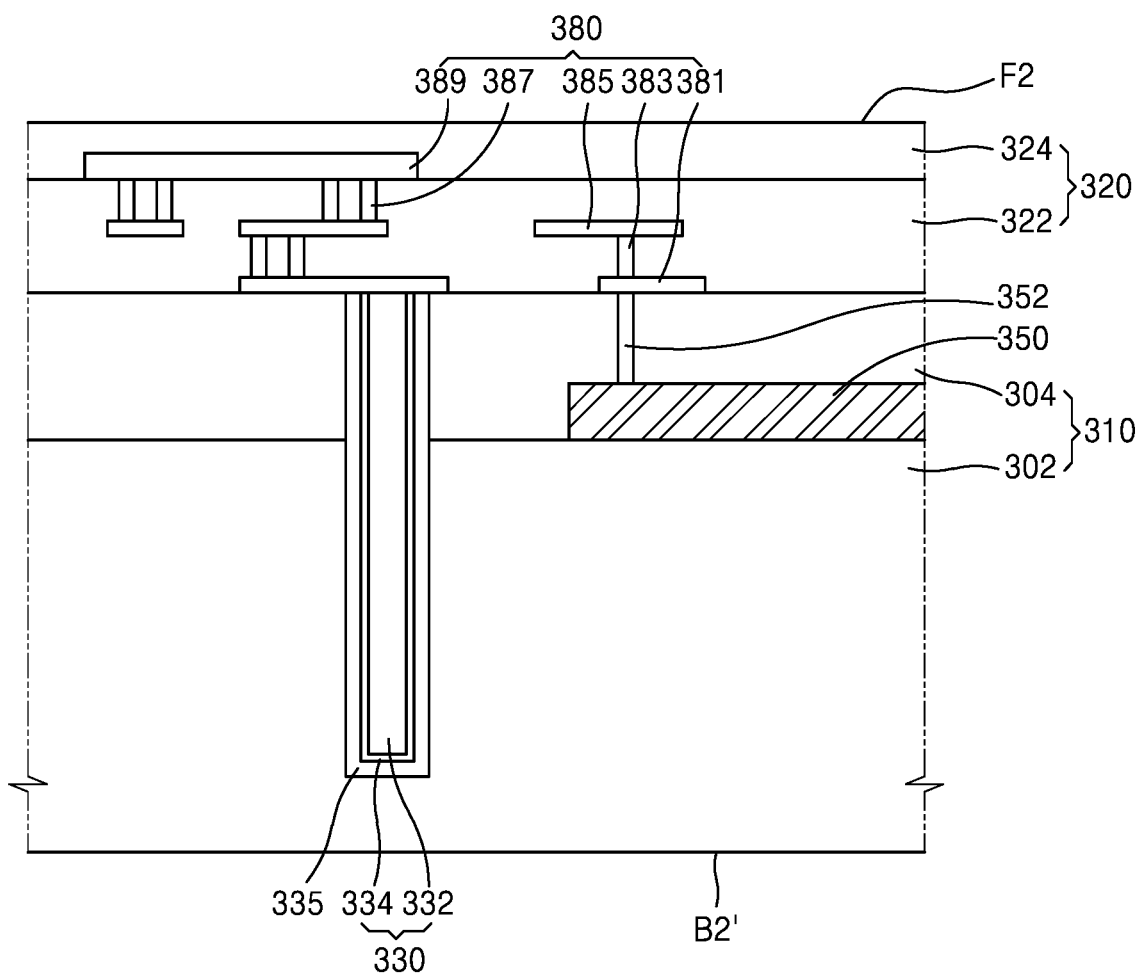

Referring to FIG. 15B, an insulating, layer 320 covering a multilayer wiring pattern 380 connected to the through via 330 may be formed. The insulating layer 320 may include an intermetallic insulating layer 322 and a passivation layer 324. For example, the multilayer wiring pattern 380 may be formed by repeating the step of forming a stacked structure of the wiring lines 381, 385 and 389 and the vertical plugs 383 and 387. The intermetallic insulating layer 322 may be formed in a multilayer structure according to the stacked structure of the multilayer wiring pattern 380. When the insulating layer 320 including the multilayer wiring pattern 380, the intermetallic insulating layer 322, and the passivation layer 324 is formed, the front surface F2 may be the surface of the passivation layer 324.

For example, the multilayer wiring pattern 380 may be formed by material film deposition and patterning, or may be formed by a damascene process. For example, when the multilayer wiring pattern 380 includes aluminum (Al) and/or tungsten (W), it may be formed by the material film deposition and patterning method, and when it includes copper (Cu), it may be formed by the damascene process.

Figure 15C:
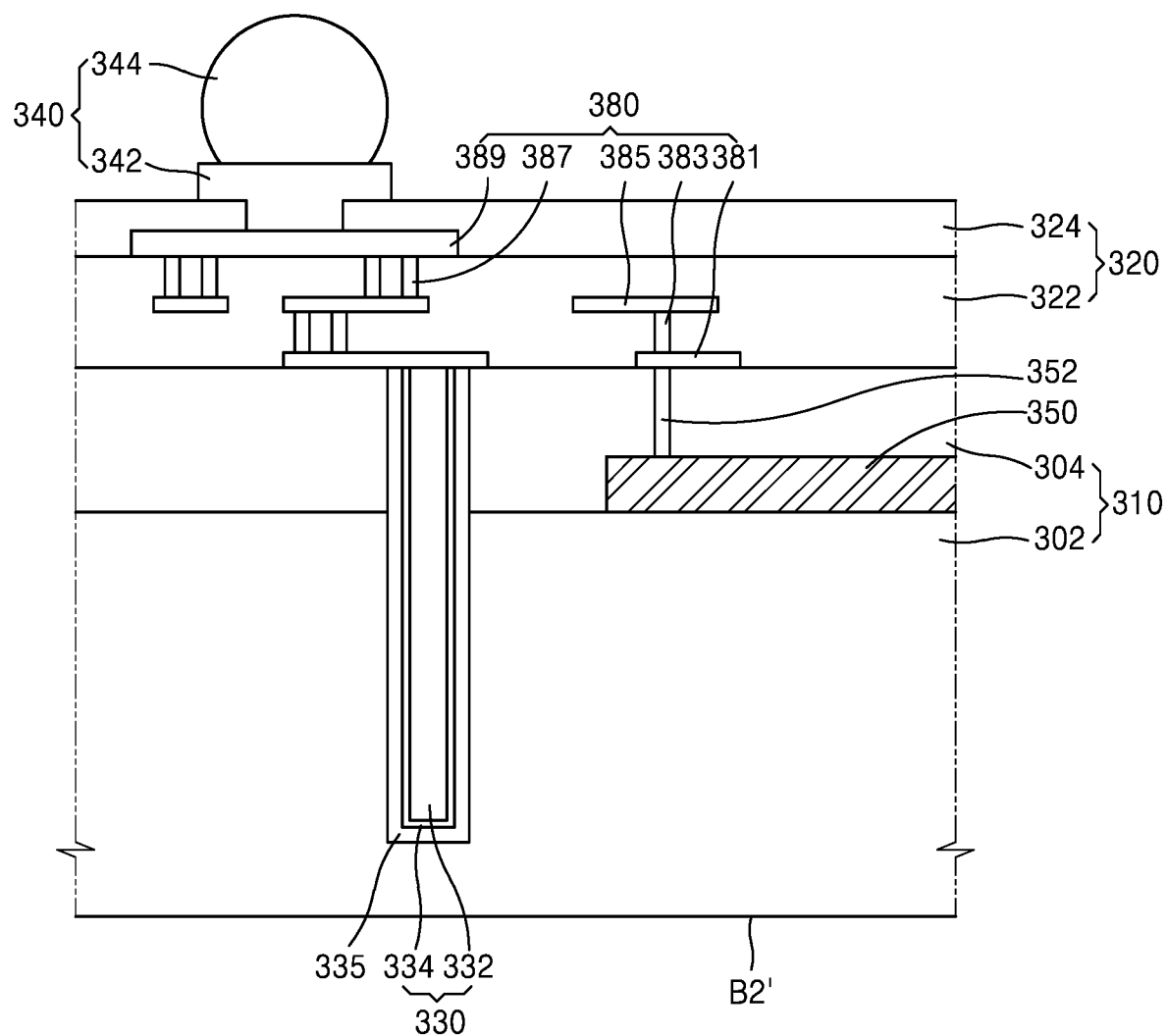

Referring to FIG. 15C, a multilayer wiring pattern 380, for example, a connection means 340 connected to the wiring line 389, may be formed on the passivation layer 324. The connection means 340 may include a connection pad 342 and a connection member 344. For example, connection pad 342 may be a bump pad. For example, connection member 344 may be a bump. The through via 330 may be formed in a via-middle structure formed after the integrated circuit layer 350 is formed and before the multilayer wiring pattern 380 is formed. If necessary, the through via 330 may be formed in a via first or via-last structure formed before the integrated circuit layer 350 is formed or after the multilayer wiring pattern 380 is formed.

Figure 15D:
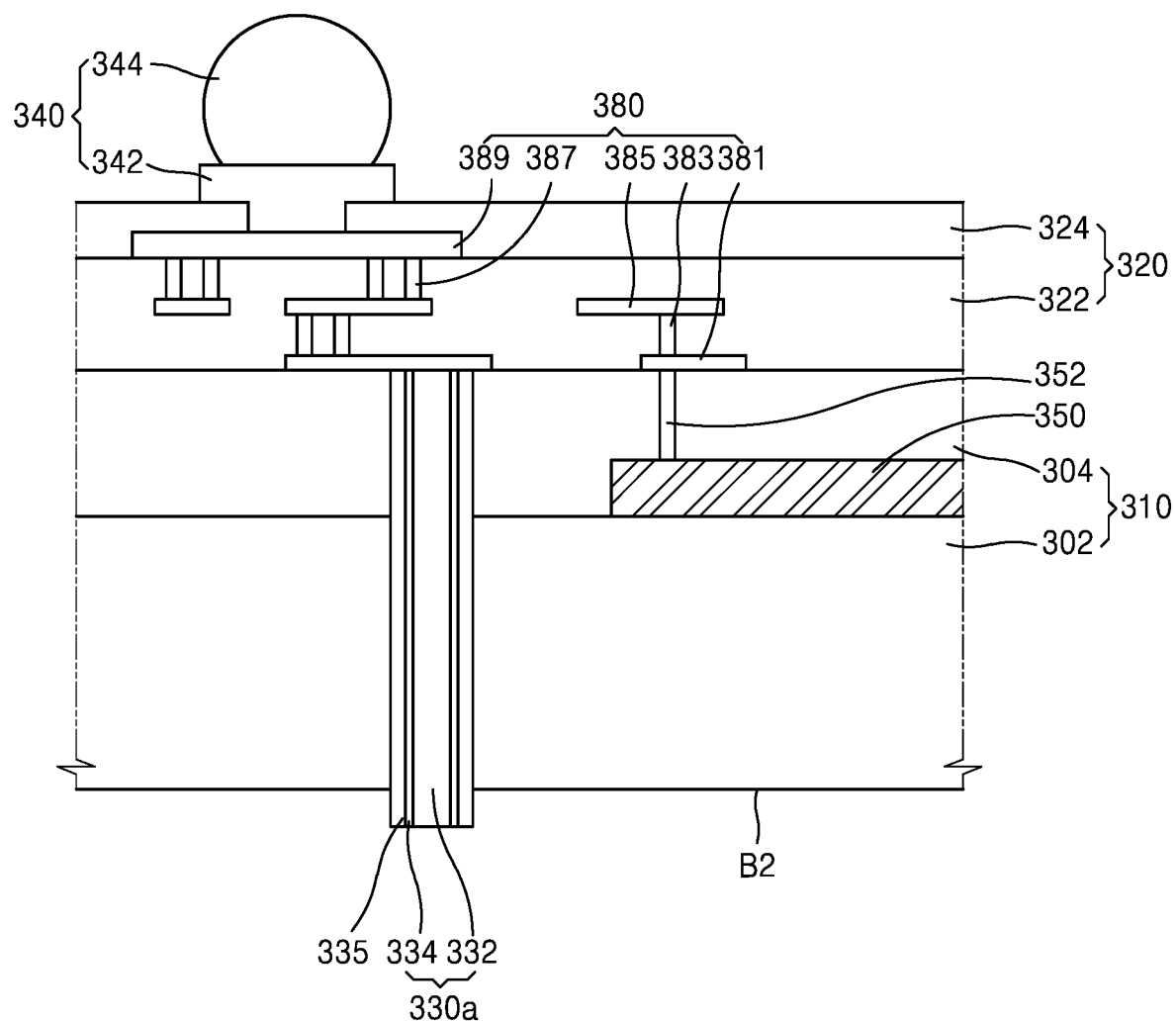
Figure 15E:
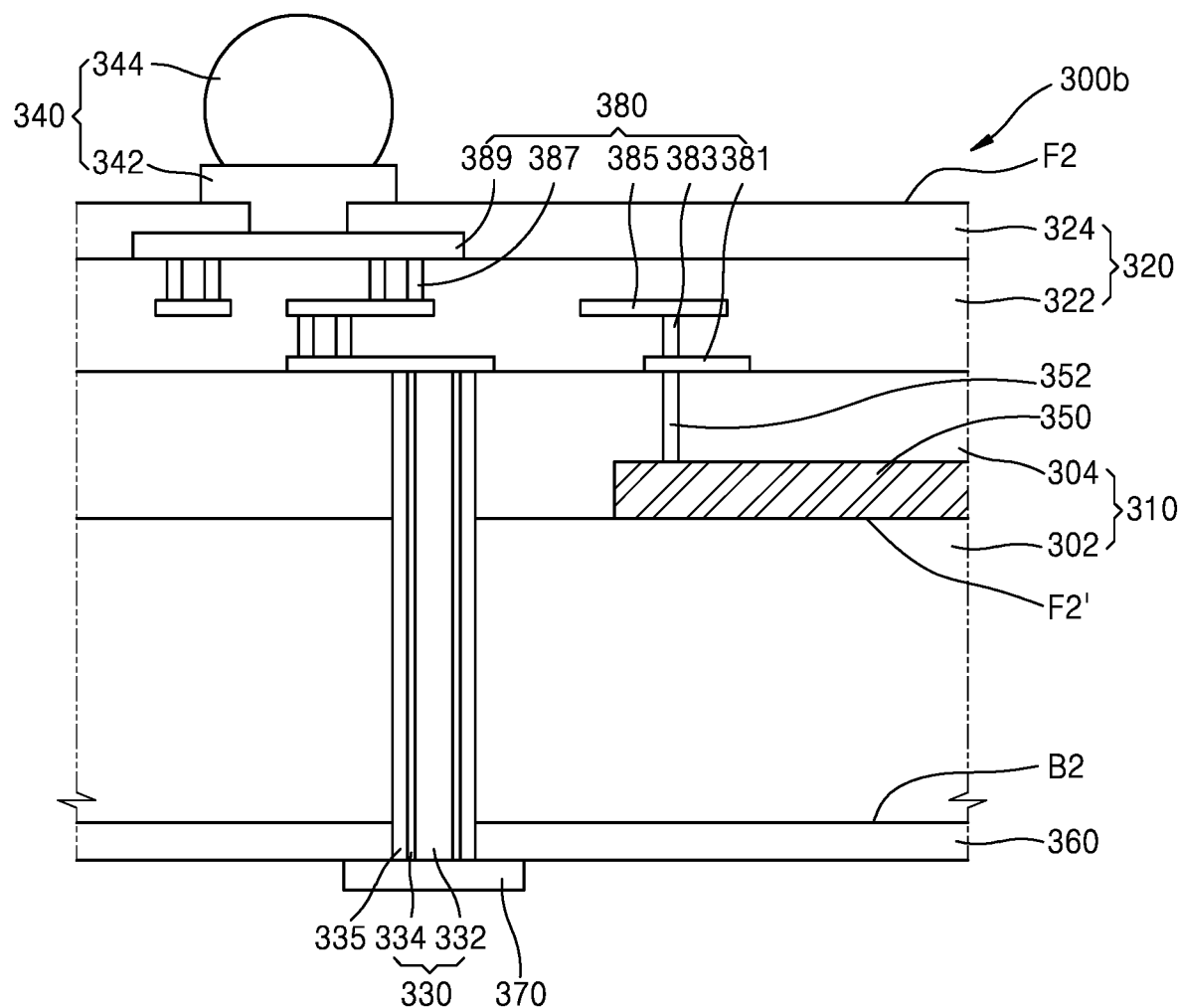

Referring to FIGS. 15D and 15E, as shown in FIG. 15D, by removing a predetermined thickness of the semiconductor substrate 302 front the rear surface B2' (see FIG. 15C) of the semiconductor substrate 302, the spacer insulating layer 335 and the through via 330 are exposed from the rear surface B2 of the semiconductor substrate 302. When the through via 330 is exposed, the rear surface B2 may be the surface of the semiconductor substrate 302 after reducing the predetermined thickness of the semiconductor substrate 302.

In addition, as shown in the drawing, the spacer insulating layer 335 and the through via 330 may be exposed and may protrude from the rear surface B2. The removal of the semiconductor substrate 302 may be performed by, far example, combining one or two or more of grinding, chemical mechanical polishing (CMP), isotropic etching, and anisotropic etching.

Subsequently, as shown in FIG. 15E, after forming the protective layer 360 on the rear surface B2 of the semiconductor substrate 302 and the protruding through via 330a, a connection pad 370 connected to the through via 330a can be formed.

Figure 16:
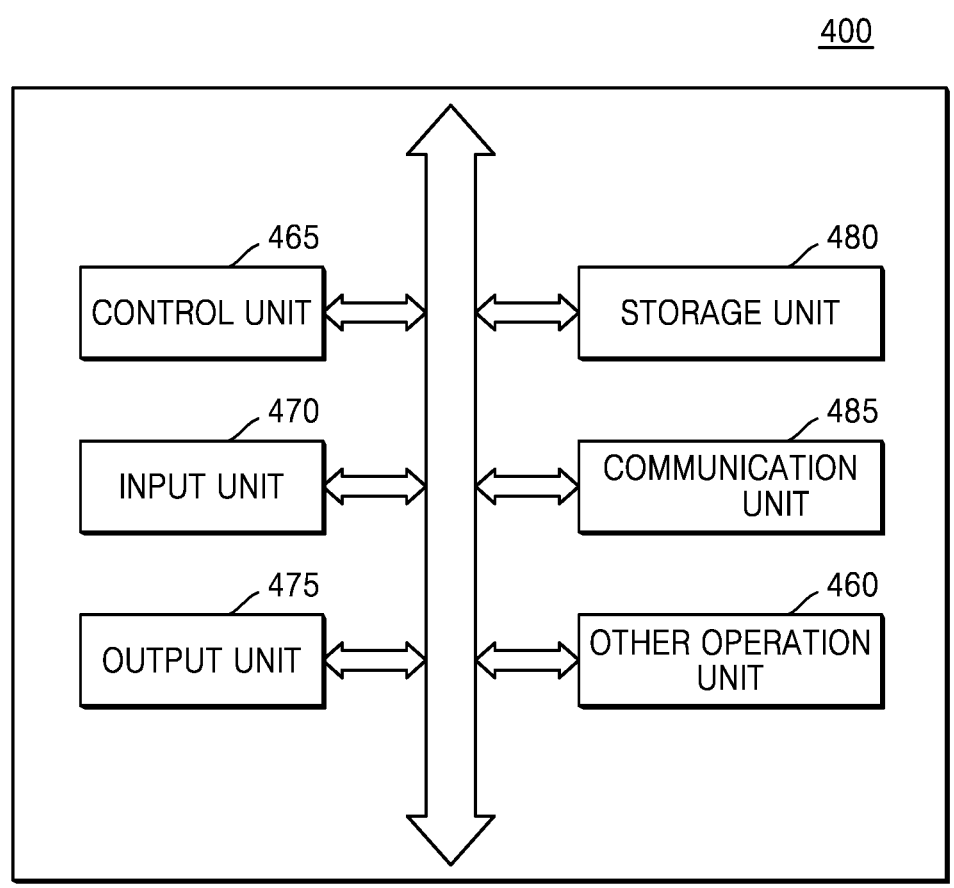
FIG. 16 is a block diagram schematically illustrating an electronic system including a chip-stacked semiconductor package according to an exemplary embodiment of the present invention.

FIG. 16 is a block diagram schematically illustrating an electronic system including a chip stacked semiconductor package according to an exemplary embodiment of the present invention.

For example, the electronic system 400 includes a control unit 465, an input unit 470, an output unit 475, and a storage unit 480, and may further include a communication unit 485 and/or another operation unit 460.

The control unit 465 may collectively control the electronic system 400 and respective parts. For example, the control unit 465 may be understood as a central processing unit or a central control unit, and may include a chip stacked semiconductor package according to an exemplary embodiment of the present invention.

The input unit 470 may transmit an electrical command signal to the control unit 465. For example, the input unit 470 may be a keyboard, a keypad, a mouse, a touch pad, an image recognizer such as a scanner, or various input sensors. The output unit 475 may receive an electrical command signal from the control unit 465 and output a result of processing by the electronic system 400. For example, the output unit 475 may be a monitor, a printer, a beam irradiator, or various mechanical devices.

The storage unit 480 may be a component for temporarily or permanently storing an electrical signal to be processed or processed by the control unit 465. The storage unit 480 may be physically and electrically connected or coupled to the control unit 465. For example, the storage unit 480 may be a semiconductor memory, a magnetic storage device such as a hard disk, an optical storage device such as a compact disk, or a server having other data storage functions.

The communication unit 485 may receive an electrical command signal from the control unit 465 and transmit or receive an electrical signal to another electronic system. For example, the communication unit 485 may be a wired transmission/reception device such as a modem or a LAN card, and a wireless transmission/reception device such as a WiBro interface, or an infrared port. The communication unit 485 may include a chip stacked semiconductor package according to an exemplary embodiment of the present invention.

The other operation unit 490 may perform physical or mechanical operations according to the command of the control unit 465. For example, the other operation unit 490 may be a component that performs mechanical operation, such as a plotter, an indicator, and an up/down operator. The electronic system 400 according to an exemplary embodiment of the present invention may be a computer, a network server, a networking printer or scanner, a wireless controller, a mobile communication terminal, a switchboard, or an electronic device that performs other programmed operations.

In addition, the electronic system 400 may be used for a mobile phone, an MP3 player, a navigation device, a portable multimedia player (PMP), a solid state disk (SSD), or household appliances.

Figure 17:
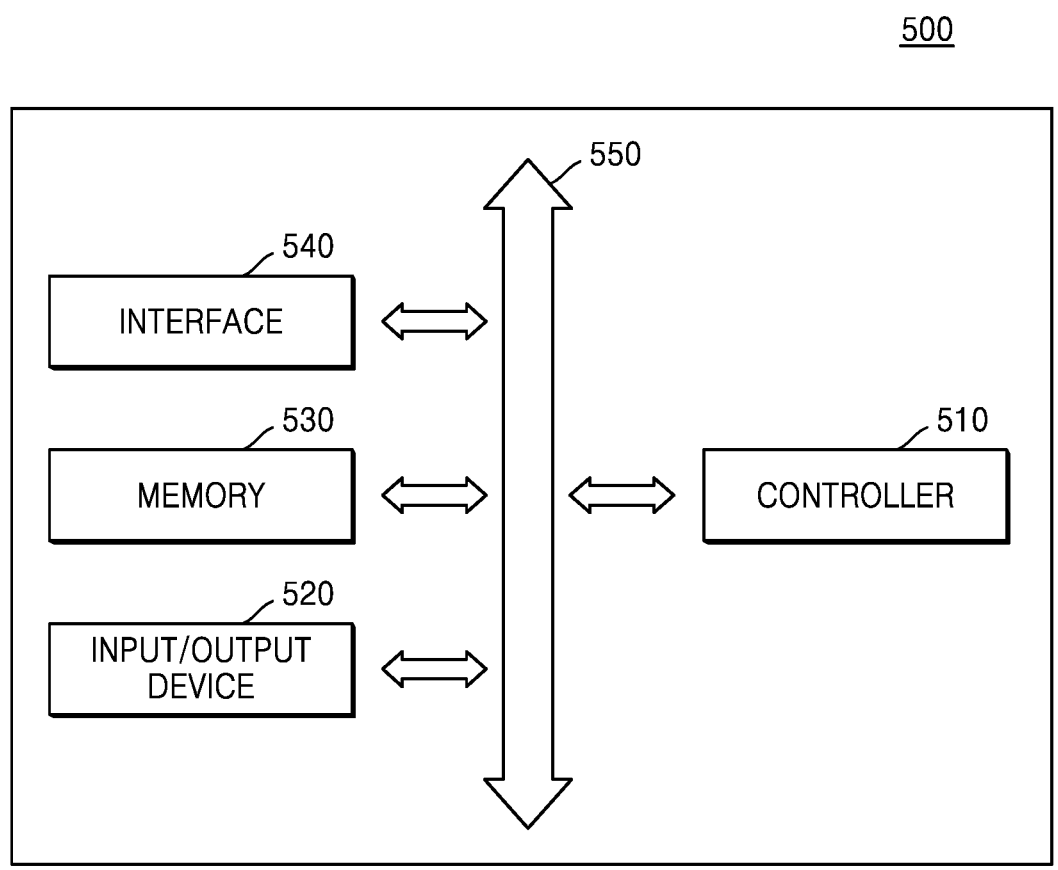
FIG. 17 is a schematic diagram showing an electronic system including a chip-stacked semiconductor package according to an exemplary embodiment of the present invention.

FIG. 17 is a schematic diagram showing an electronic system including a chip stacked semiconductor package according to an exemplary embodiment of the present invention.

For example, an electronic system 500 may include a controller 510, an input/output device 520, a memory 530, and an interface 540. The electronic system 500 may be, for example, a mobile system or a system that transmits or receives information. The mobile system may be a PDA, a portable computer, a web tablet, a wireless phone, a mobile phone, a digital music player, or a memory card.

The controller 510 may serve to execute a program and control the electronic system 500. The controller 510 may include a chip stacked semiconductor package according to an exemplary embodiment of the present invention. The controller 510 may be, for example, a microprocessor, a digital signal processor, a microcontroller, or a similar device.

The input/output device 520 may be used to input or output data of the electronic system 500. The electronic system 500 may be connected to an external device, such as a personal computer or a network, using the input/output device 520 to exchange data with the external device. The input/output device 720 may be, for example, a keypad, a keyboard, or a display.

The memory 530 may store code and/or data for the operation of the controller 510 and/or the data processed by the controller 710. The memory 530 may include a chip stacked semiconductor package according to an exemplary embodiment of the present invention. The interface 540 may be a data transmission path between the electronic system 500 and other external devices. The controller 510, the input/output device 520, the memory 530, and the interface 540 may communicate with each other through the bus 550.

For example, such an electronic system 500 may be used for a mobile phone, an MP3 player, a navigation device, a portable multimedia player (PMP), a solid state disk (SSD), or household appliances.

While the present invention has been described with reference to exemplary embodiments thereof, it will be understood by those of ordinary skill in the art that various changes in form and details may be made thereto without departing from the spirit and scope of the present invention.

What is claimed is:

1. A chip-stacked semiconductor package comprising:
   a base chip having a base through via;
   a first chip stacked on the base chip in an offset form, wherein the first chip has a first exposed surface and a first through via electrically connected to the base through via, wherein the first exposed surface is substantially perpendicular to an upper surface of the base chip;

a first molding layer positioned on the base chip and covering a first non-exposed surface, facing the first exposed surface, of the first chip;

a second chip stacked on the first chip in an offset form, wherein the second chip has a second exposed surface and a second through via electrically connected to the first through via, wherein the second exposed surface is substantially perpendicular to the upper surface of the base chip; and a second molding layer formed on the first chip and covering a second non-exposed surface, facing the second exposed surface, of the second chip.

2. The chip-stacked semiconductor package of claim 1, wherein a width of the base chip is greater than a width of the first chip and a width of the second chip.

3. The chip-stacked semiconductor package of claim 1, wherein the base through via is mirror symmetrical with respect to the first through via, and the second through via is mirror symmetrical with respect to the first through via.

4. The chip-stacked semiconductor package of claim 1, wherein the base through via, the first through via and the second through via are not positioned at a center of the base chip, a center of the first chip and a center of the second chip, respectively.

5. The chip-stacked semiconductor package of claim 1, wherein an upper surface of the second chip is exposed.

6. The chip-stacked semiconductor package of claim 1, wherein the first chip is offset-stacked on the base chip in a first offset direction with respect to the base chip, and the second chip is offset-stacked on the first chip in a second offset direction opposite to the first offset direction with respect to the first chip.

7. The chip-stacked semiconductor package of claim 1, wherein the base chip is a buffer chip or a logic chip, and the first chip and the second chip are of the same type or different types of chips as each other.

8. The chip-stacked semiconductor package of claim 1, wherein the base through via of the base chip further comprises an external connection member, and the external connection member is connected to a connection pad of a printed circuit board or an interposer board.

9. A chip-stacked semiconductor package comprising:
a base chip having a base through via;
a plurality of middle chips stacked on the base chip in an offset form, wherein the middle chips each have an exposed surface and a through via electrically connected to a first connection member that is connected to the base through via;
a first molding layer disposed on the base chip, and covering a non-exposed surface of at least one middle chip of the plurality of middle chips, wherein the exposed surface of the at least one middle chip is substantially coplanar with a side surface of the base chip;
an upper chip stacked on an uppermost middle chip among the middle chips in an offset form and having a second connection member electrically connected to the through via of the uppermost middle chip; and
a second molding layer formed to be in contact with a side surface of the upper chip.

10. The chip stacked semiconductor package of claim 9, wherein a width of the base chip is greater than a width of each of the middle chips and the upper chip.

11. The chip-stacked semiconductor package of claim 9, wherein the through via of a first middle chip of the plurality of middle chips is mirror symmetrical with respect to the base through via, and the second connection member overlaps the through via of the uppermost middle chip.

12. The chip-stacked semiconductor package of claim 9, wherein a surface of the upper chip is exposed.

13. The chip-stacked semiconductor package of claim 9, wherein the middle chips comprise a first middle chip and a second middle chip, wherein the first middle chip is stacked on the base chip and misaligned with the base chip, and wherein the second middle chip is stacked on the first middle chip and misaligned with the first middle chip.

14. The chip-stacked semiconductor package of claim 9, wherein the base chip is a buffer chip or a logic chip, and the middle chips and upper chips are the same or different types of chips from each other.

15. A chip-stacked semiconductor package comprising:
a base chip including a base chip body, a base through via, and an external connection member, wherein the base chip body has a base front surface and a base rear surface opposite to the base front surface, wherein the base through via passes through the base chip body, and the external connection member is disposed on the base front surface and is electrically connected to the base through via;
a first chip stacked in an offset form on the base rear surface of the base chip, wherein the first chip includes a first chip body, a first through via, and a first connection member, wherein the first chip body has a first front surface, a first rear surface opposite to the first front surface, and a first exposed surface, wherein the first through via passes through the first chip body, and the first connection member is electrically connected to the base through via;
a first molding layer formed on a base rear surface of the base chip in contact with a first non-exposed surface, facing the first exposed surface, of the first chip;
a second chip stacked in an offset form on the first rear surface of the first chip, wherein the second chip includes a second through via, a second connection member, and a second chip body having a second front surface, a second rear surface opposite to the second front surface, and a second exposed surface, wherein the second through via passes through the second chip body, and the second connection member is electrically connected to the first through via; and
a second molding layer formed on the first rear surface of the first chip to be in contact with a second non-exposed surface, facing the second exposed surface, of the second chip, wherein an underfill layer is further formed between the base rear surface of the base chip and the first front surface of the first chin, and between the first rear surface of the first chip and the second front surface of the second chip.

16. The chip-stacked semiconductor package of claim 15, wherein a width of the base chip is greater than a width of each of the first chip and the second chip, wherein the base through via is mirror symmetrical with respect to the first through via, and wherein the second through-via is mirror symmetrical with respect to the first through-via.

17. The chip-stacked semiconductor package of claim 15, wherein an upper surface of the second chip is exposed, and the second molding layer is formed on two sides of the second chip.

18. The chip-stacked semiconductor package of claim 15, wherein the first chip is offset-stacked in a first direction on the base chip, and the second chip is offset-stacked in a second direction, opposite to the first direction, on the first chip.

19. The chip-stacked semiconductor package of claim 15, wherein the first chip is offset-stacked on the base chip in the second direction and a third direction crossing the second direction, and the second chip is offset-stacked on the first chip in the first direction and a fourth direction opposite to the third direction.

\* \* \* \* \*